United States Patent
Nishi

(10) Patent No.: US 10,971,608 B2
(45) Date of Patent: Apr. 6, 2021

(54) SEMICONDUCTOR DEVICE

(71) Applicant: Mitsubishi Electric Corporation, Tokyo (JP)

(72) Inventor: Koichi Nishi, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 16/557,435

(22) Filed: Aug. 30, 2019

(65) Prior Publication Data

US 2020/0144403 A1 May 7, 2020

(30) Foreign Application Priority Data

Nov. 7, 2018 (JP) .............................. JP2018-209504

(51) Int. Cl.
*H01L 29/739* (2006.01)
*H01L 29/40* (2006.01)
*H01L 29/423* (2006.01)

(52) U.S. Cl.
CPC ........ *H01L 29/7397* (2013.01); *H01L 29/407* (2013.01); *H01L 29/4236* (2013.01)

(58) Field of Classification Search
CPC ............... H01L 29/7397; H01L 29/407; H01L 29/4238; H01L 29/42376
See application file for complete search history.

(56) References Cited

U.S. PATENT DOCUMENTS

| 2014/0077293 | A1  | 3/2014 | Kitagawa |
|---|---|---|---|
| 2016/0163696 | A1  | 6/2016 | Takahashi |
| 2017/0069741 | A1* | 3/2017 | Na ..................... H01L 29/41741 |
| 2018/0019331 | A1* | 1/2018 | Sumitomo ............ H01L 23/485 |

FOREIGN PATENT DOCUMENTS

| JP | 2014/0077293 A1 | 4/2014 |
|---|---|---|
| JP | 2016-111077 A | 6/2016 |
| JP | 2017-147431 A | 8/2017 |

* cited by examiner

*Primary Examiner* — Changhyun Yi
(74) *Attorney, Agent, or Firm* — Studebaker & Brackett PC

(57) ABSTRACT

A semiconductor substrate has a first surface and a second surface provided with an opening of a trench. A first-conductivity-type carrier storage layer is provided on the second surface side of a first-conductivity-type drift layer. A second-conductivity-type base layer is provided on the second surface side of the carrier storage layer and reaches the second surface. A first-conductivity-type impurity layer is provided on the second surface side of the base layer. A trench electrode is provided in the trench via an internal insulating film. The internal insulating film has a first thickness at a portion facing the base layer, has a second thickness at a portion facing the drift layer, and has the first thickness and the second thickness at a portion facing the carrier storage layer. The second thickness is thicker than the first thickness.

21 Claims, 22 Drawing Sheets

F I G. 1 5
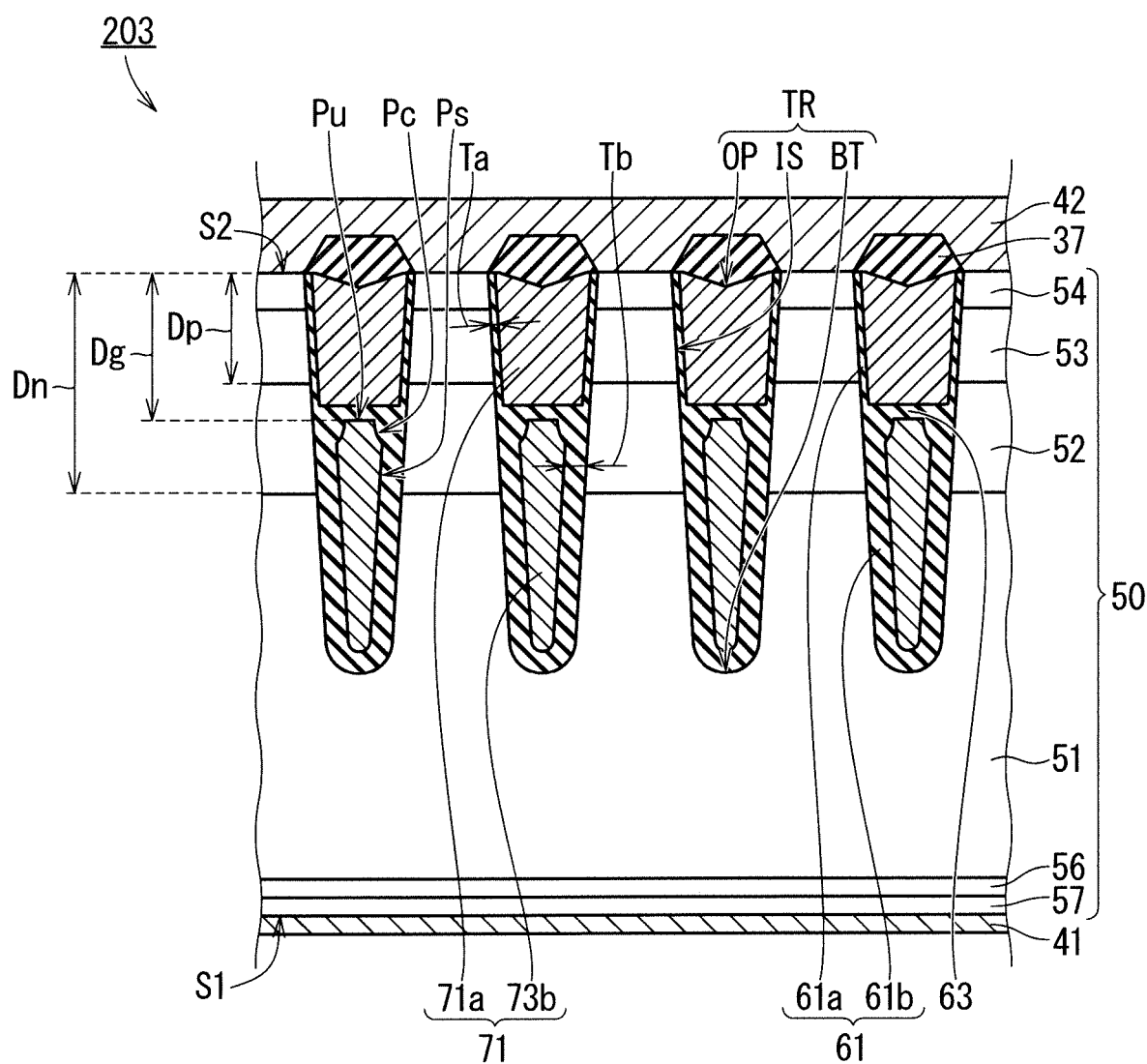

SEMICONDUCTOR DEVICE

BACKGROUND OF THE INVENTION

Field of the Invention

The present invention relates to a semiconductor device, and particularly to a semiconductor device having a trench electrode.

Description of the Background Art

Semiconductor switching elements (semiconductor devices) such as insulated gate bipolar transistors (IGBTs) are, for example, widely used for power modules for performing variable speed control of a three-phase motor, in the fields of general-purpose inverters and alternating current (AC) servos. From the viewpoint of energy saving, it is desired to reduce power loss of semiconductor switching elements. The power loss of semiconductor switching elements is mainly caused by ON-loss and switching loss.

For example, according to Japanese Patent Application Laid-Open No. 2016-111077, an IGBT having a trench gate structure is disclosed. By applying the trench gate structure, ON-loss can be reduced by improving a channel density. Further, in the IGBT disclosed in Japanese Patent Application Laid-Open No. 2016-111077 described above, a carrier storage layer having an impurity concentration higher than an impurity concentration of a drift layer is disposed under a base layer, whereby the loss can be further reduced.

One method for reducing switching loss of a trench gate IGBT is to reduce a gate-collector capacitance (hereinafter also referred to as "Cgc"), which is one of parasitic capacitances. However, for an IGBT having a carrier storage layer, a method of reducing Cgc while suppressing adverse effects on other characteristics has not been sufficiently studied so far. More generally speaking, in a semiconductor device having a carrier storage layer, a method of reducing the parasitic capacitance while suppressing adverse effects on other characteristics has not been sufficiently studied so far.

SUMMARY

The present invention has been made to solve the problems as described above, and an object thereof is to provide a semiconductor device capable of suppressing switching loss while providing a carrier storage layer.

The semiconductor device according to the present invention has a semiconductor substrate, an internal insulating film, and a trench electrode. The semiconductor substrate has a first surface, and a second surface that is a surface opposite to the first surface and provided with an opening of a trench. The semiconductor substrate has a drift layer of a first conductivity type, a carrier storage layer of the first conductivity type, a base layer of a second conductivity type, and an impurity layer of the first conductivity type. The carrier storage layer is provided on the second surface side of the drift layer, and has an impurity concentration higher than an impurity concentration of the drift layer. The base layer is provided on the second surface side of the carrier storage layer and reaches the second surface. The impurity layer is provided on the second surface side of the base layer. The trench penetrates the impurity layer, the base layer, and the carrier storage layer to reach the drift layer. The internal insulating film covers an inner surface of the trench. The trench electrode is provided inside the trench so as to face the drift layer, the carrier storage layer, the base layer, and the impurity layer via the internal insulating film. The internal insulating film has a first thickness at a portion facing the base layer, has a second thickness at a portion facing the drift layer, and has the first thickness and the second thickness at a portion facing the carrier storage layer. The second thickness is thicker than the first thickness.

According to the present invention, the internal insulating film has a first thickness at a portion facing the base layer, has a second thickness at a portion facing the drift layer, and has the first thickness and the second thickness at a portion facing the carrier storage layer. The second thickness is thicker than the first thickness. This reduces a parasitic capacitance due to the trench electrode, without affecting voltage threshold characteristics for a channel formed by the base layer. This reduction of the parasitic capacitance can suppress switching loss of the semiconductor device.

These and other objects, features, aspects and advantages of the present invention will become more apparent from the following detailed description of the present invention when taken in conjunction with the accompanying drawings.

BRIEF DESCRIPTION OF THE DRAWINGS

FIG. 15 is a partial cross-sectional view schematically showing a configuration of a semiconductor device in a fifth preferred embodiment of the present invention;

DESCRIPTION OF THE PREFERRED EMBODIMENTS

Figure 1:
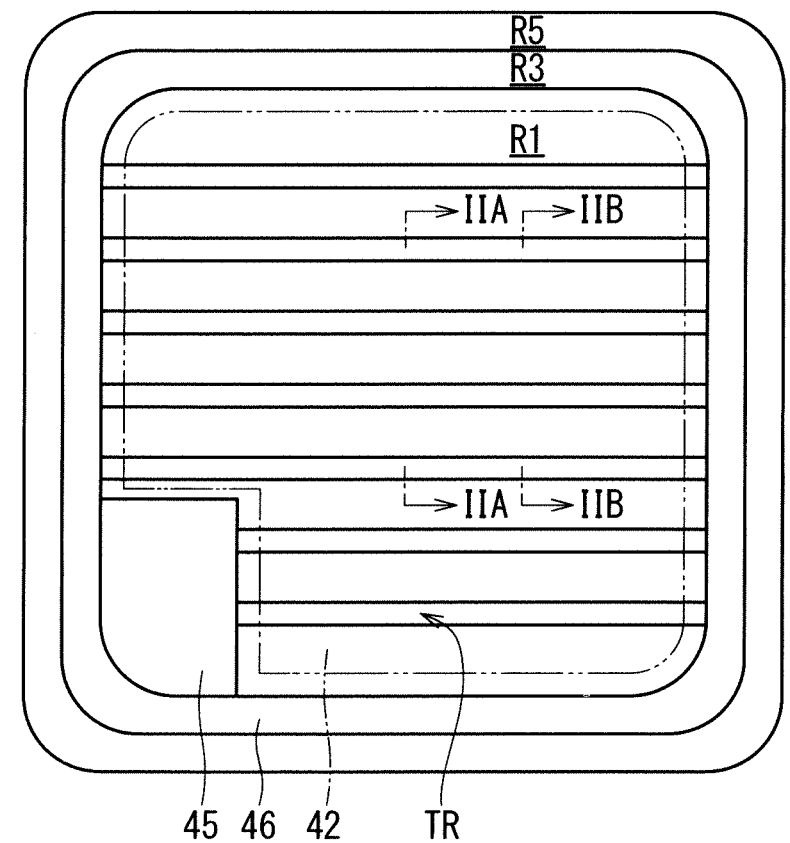
FIG. 1 is a top view schematically showing a configuration of a semiconductor device in a first preferred embodiment of the present invention.

Hereinafter, preferred embodiments of the present invention will be described with reference to the drawings. Note that, in the following drawings, the same or corresponding parts are denoted by the same reference numerals and description thereof will not be repeated.

First Preferred Embodiment (Configuration)

Figure 2A:
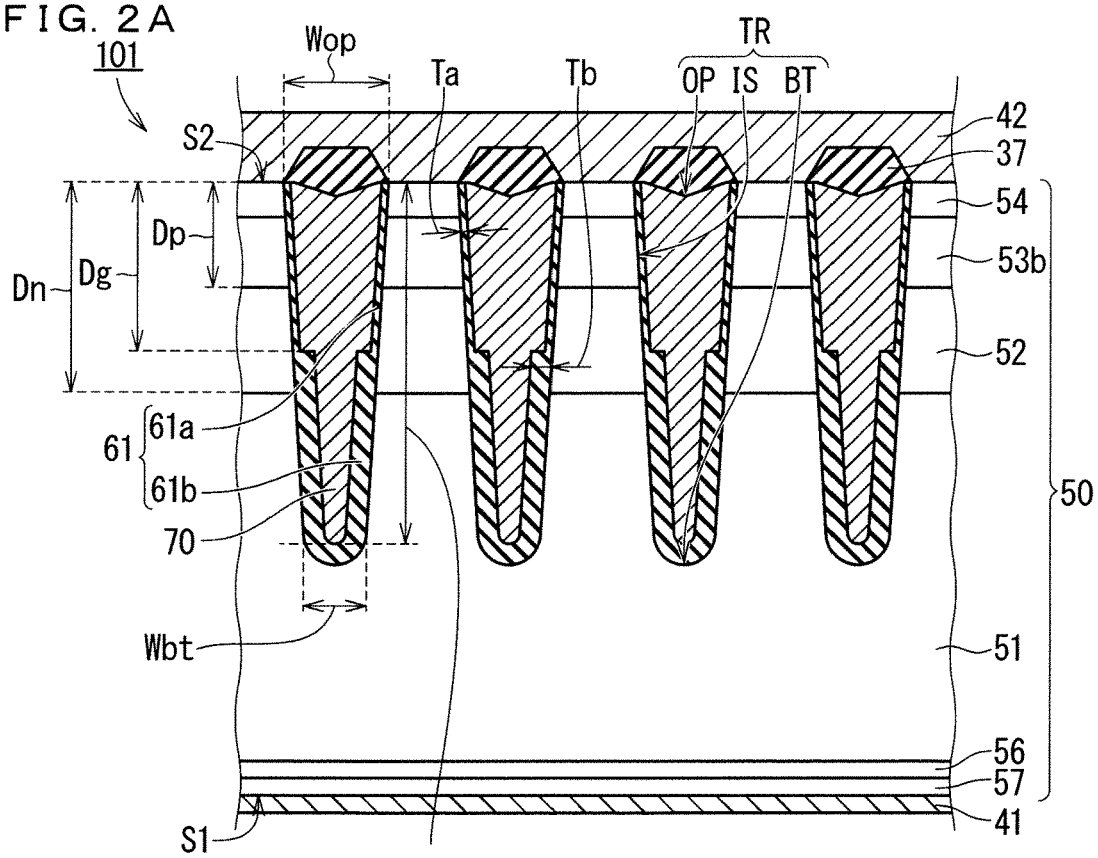
FIGS. 2A and 2B are partial cross-sectional views along lines IIA-IIA and IIB-IIB in FIG. 1, respectively.
Figure 2B:
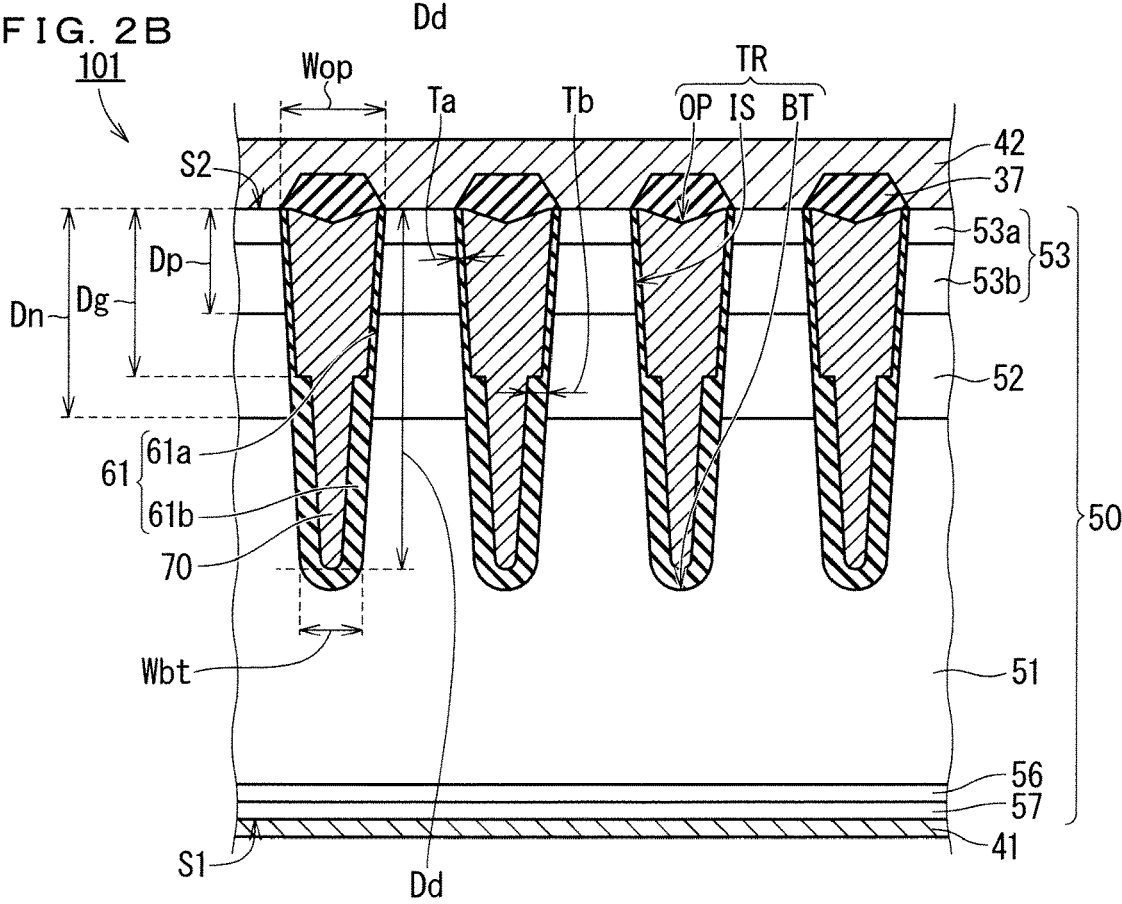
Figure 3:
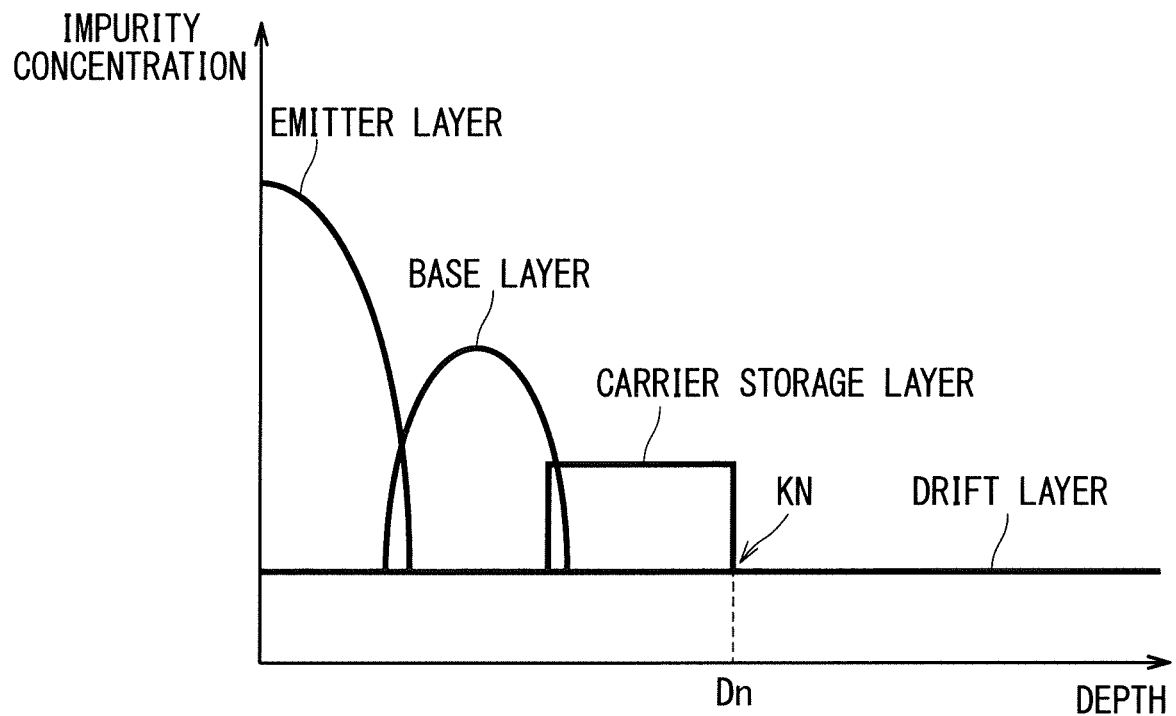
FIG. 3 is a graph showing a first example of an impurity concentration profile of a semiconductor substrate of the semiconductor device of FIGS. 2A and 2B.
Figure 4:
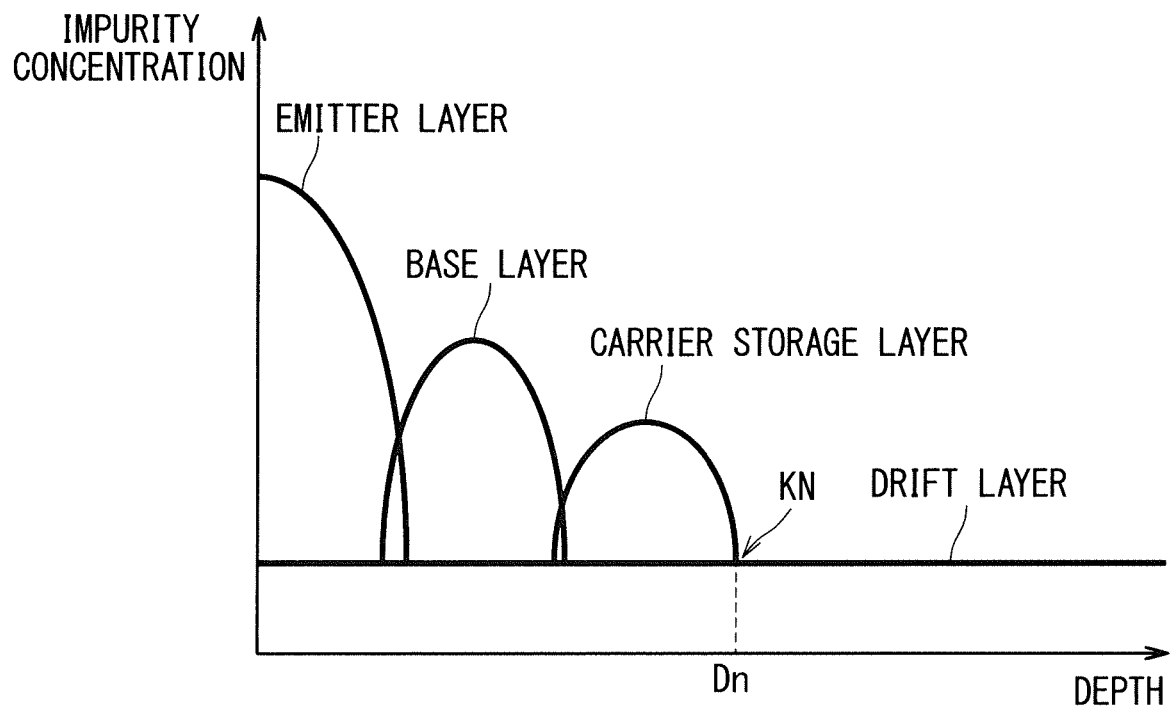
FIG. 4 is a graph showing a second example of the impurity concentration profile of the semiconductor substrate of the semiconductor device of FIGS. 2A and 2B.
Figure 5:
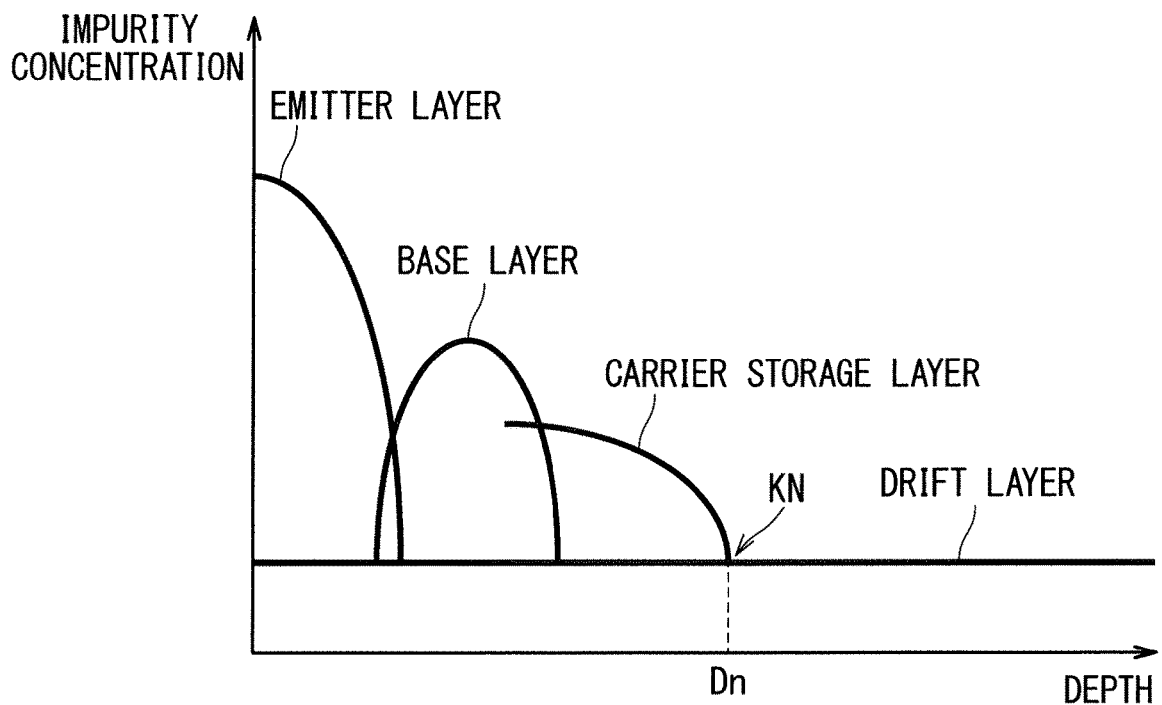
FIG. 5 is a graph showing a third example of the impurity concentration profile of the semiconductor substrate of the semiconductor device of FIGS. 2A and 2B.
Figure 6:
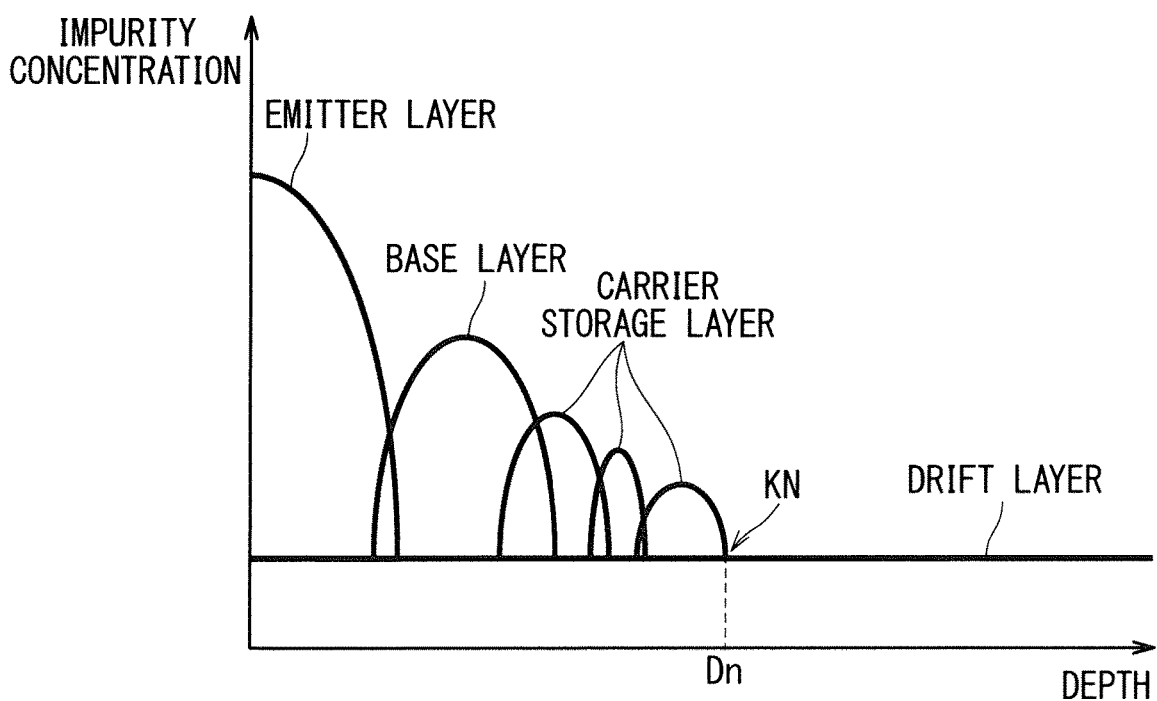
FIG. 6 is a graph showing a fourth example of the impurity concentration profile of the semiconductor substrate of the semiconductor device of FIGS. 2A and 2B.

FIG. 1 is a top view schematically showing a configuration of an IGBT 101 (semiconductor device) in a first preferred embodiment. FIGS. 2A and 2B are partial cross-sectional views adjacent to each other in a cell region R1 (FIG. 1) of the IGBT 101, and specifically are partial cross-sectional views along line IIA-IIA and line IIB-IIB in FIG. 1. Meanwhile, in FIG. 1, an outer edge of an emitter electrode 42 (second main electrode) is exclusively shown by a two-dot chain line in order to make the drawing easily viewable.

The IGBT 101 has a semiconductor substrate 50, an internal insulating film 61, a trench electrode 70, a collector electrode 41 (first main electrode), the emitter electrode 42, and an interlayer insulating film 37. The semiconductor substrate 50 has a surface S1 (first surface) and a surface S2 (second surface) that is a surface opposite to the surface S1. In this specification, a "depth" in the semiconductor substrate 50 is defined as a distance from the surface S2. The semiconductor substrate 50 has an $n^-$ drift layer 51, an n carrier storage layer 52, a p base layer 53, an $n^+$ emitter layer 54 (impurity layer), and a p collector layer 57. The semiconductor substrate 50 may further have an n buffer layer 56.

The $n^-$ drift layer 51 has a lower surface facing the surface S1 and an upper surface facing the surface S2. The $n^-$ drift layer 51 has an n type (first conductivity type). The n carrier storage layer 52 is provided on the surface S2 side, and specifically, provided on the upper surface of the $n^-$ drift layer 51. The n carrier storage layer 52 has n type, and has an impurity concentration higher than that of the $n^-$ drift layer 51. The p base layer 53 is provided on the surface S2 side of the n carrier storage layer 52, and specifically, provided on an upper surface of the n carrier storage layer 52. The p base layer 53 has p type (a second conductivity type different from the first conductivity type). The p base layer 53 is formed of a p base layer 53b of a p type and a p base layer 53a of a $p^+$ type. The p base layer 53 does not reach the surface S2 at a cross sectional position of FIG. 2A, but reaches the surface S2 at another cross sectional position adjacent to the cross section of FIG. 2A, as shown in FIG. 2B. In FIG. 2B, in the p base layer 53, the p base layer 53a of a $p^+$ type is formed by increasing an impurity concentration of a region including a surface reaching the surface S2. However, the region including the surface reaching the surface S2 may also be integrally formed with the p base layer 53b, without increasing of the impurity concentration of the surface reaching the surface S2. Hereinafter, the p base layer 53 is to be shown while a distinction between the p base layer 53a and the p base layer 53b is omitted. However, the p base layer 53 described below may also be formed of the p base layer 53a and the p base layer 53b similarly to FIGS. 2A and 2B, or may also be formed by the p base layer 53b alone. The $n^+$ emitter layer 54 is selectively provided on the surface S2 side of the p base layer 53. Specifically, the $n^+$ emitter layer 54 is partially provided on an upper surface side of the p base layer 53 and reaches the surface S2. The $n^+$ emitter layer 54 has an n type. The n buffer layer 56 has an n type, and has an impurity concentration higher than that of the $n^-$ drift layer 51. The n buffer layer 56 is disposed between the $n^-$ drift layer 51 and the collector electrode 41, and specifically, is disposed between the $n^-$ drift layer 51 and the p collector layer 57. The p collector layer 57 is provided on the lower surface of the $n^-$ drift layer 51 via the n buffer layer 56. The n buffer layer 56 may be omitted.

The collector electrode 41 is provided on the first surface S1 of the semiconductor substrate 50. The collector electrode 41 is electrically connected to the p collector layer 57 by being in contact with the p collector layer 57. The emitter electrode 42 is provided on the surface S2 of the semiconductor substrate 50. The emitter electrode 42 is electrically connected to the $n^+$ emitter layer 54 (impurity layer) by being in contact with the $n^+$ emitter layer 54.

The semiconductor substrate 50 is provided with a trench TR. The trench TR has a bottom part BT, an opening OP, and an inner surface IS connecting the bottom part BT and the opening OP. The opening OP of the trench TR is provided on the surface S2 of the semiconductor substrate 50. The trench TR penetrates the $n^+$ emitter layer 54, the p base layer 53, and the n carrier storage layer 52 to reach the $n^-$ drift layer 51. A width Wbt of the trench TR at a depth of the deepest part of the trench electrode 70 is desirably smaller than a width Wop of the opening OP on the surface S2. In other words, the trench TR desirably has the width Wbt smaller than the width Wop at a depth Dd of the deepest part (the lowermost portion in FIGS. 2A and 2B) of a boundary between the internal insulating film 61 and the trench electrode 70.

The internal insulating film 61 covers an inner surface of the trench TR. The trench electrode 70 is provided in the trench TR so as to face the n⁻ drift layer 51, the n carrier storage layer 52, the p base layer 53, and the n⁺ emitter layer 54 via the internal insulating film 61. The internal insulating film 61 has a thickness Ta (first thickness) at a portion facing the p base layer 53, has a thickness Tb (second thickness) at a portion facing the n⁻ drift layer 51, and has the thickness Ta and the thickness Tb at a portion facing the n carrier storage layer 52. The thickness Tb is thicker than the thickness Ta. A depth of a boundary between the p base layer 53 and the n carrier storage layer 52 is defined as Dp, a depth of a boundary between the n carrier storage layer 52 and the n⁻ drift layer 51 is defined as Dn, and one depth satisfying Dp<Dg<Dn is defined as a depth Dg. The internal insulating film 61 has an upper portion 61a disposed shallower than the depth Dg and a lower portion 61b disposed deeper than the depth Dg. The lower portion 61b desirably has the thickness Tb thicker than the thickness Ta. In the present preferred embodiment, the thickness of the lower portion 61b may be uniform.

Meanwhile, it is sufficient that features of the thickness of the internal insulating film 61 described above are satisfied within the cell region R1, and are not necessarily satisfied outside the cell region R1.

The semiconductor substrate 50 (FIGS. 2A and 2B) has, as a layout in an in-plane direction (direction perpendicular to the thickness direction of the semiconductor substrate 50) or a planar layout (FIG. 1): a cell region R1; a gate wiring region R3 disposed outside the cell region R1; and a termination region R5 provided outside the cell region R1 and the gate wiring region R3. The gate wiring region R3 is a region for applying a gate potential to the trench electrode 70. For this purpose, the gate wiring region R3 is provided with a gate wiring layer 46. The gate wiring layer 46 connects a gate pad 45 and the trench electrode 70 to each other. The gate pad 45 is an electrode for applying a gate potential to the IGBT 101 from the outside. The termination region R5 is typically provided with a structure for improving a withstand voltage, such as a guard ring (not shown).

FIGS. 3 to 6 respectively show first to fourth examples of an impurity concentration profile of the semiconductor substrate 50 in the depth direction. Note that this profile is a profile in the partial cross-sectional view shown in FIG. 2A. In these examples, at the depth Dn, a kink KN in the impurity concentration profile is observed. Therefore, the depth Dn can be measured by performing impurity concentration profile analysis in the depth direction. Further, in these examples, a minimum value of an impurity concentration of the n carrier storage layer 52 is higher than a maximum value of an impurity concentration of the n⁻ drift layer 51. Typically, the impurity concentration of the n⁻ drift layer 51 is approximately uniform (constant).

COMPARATIVE EXAMPLE

Figure 7:
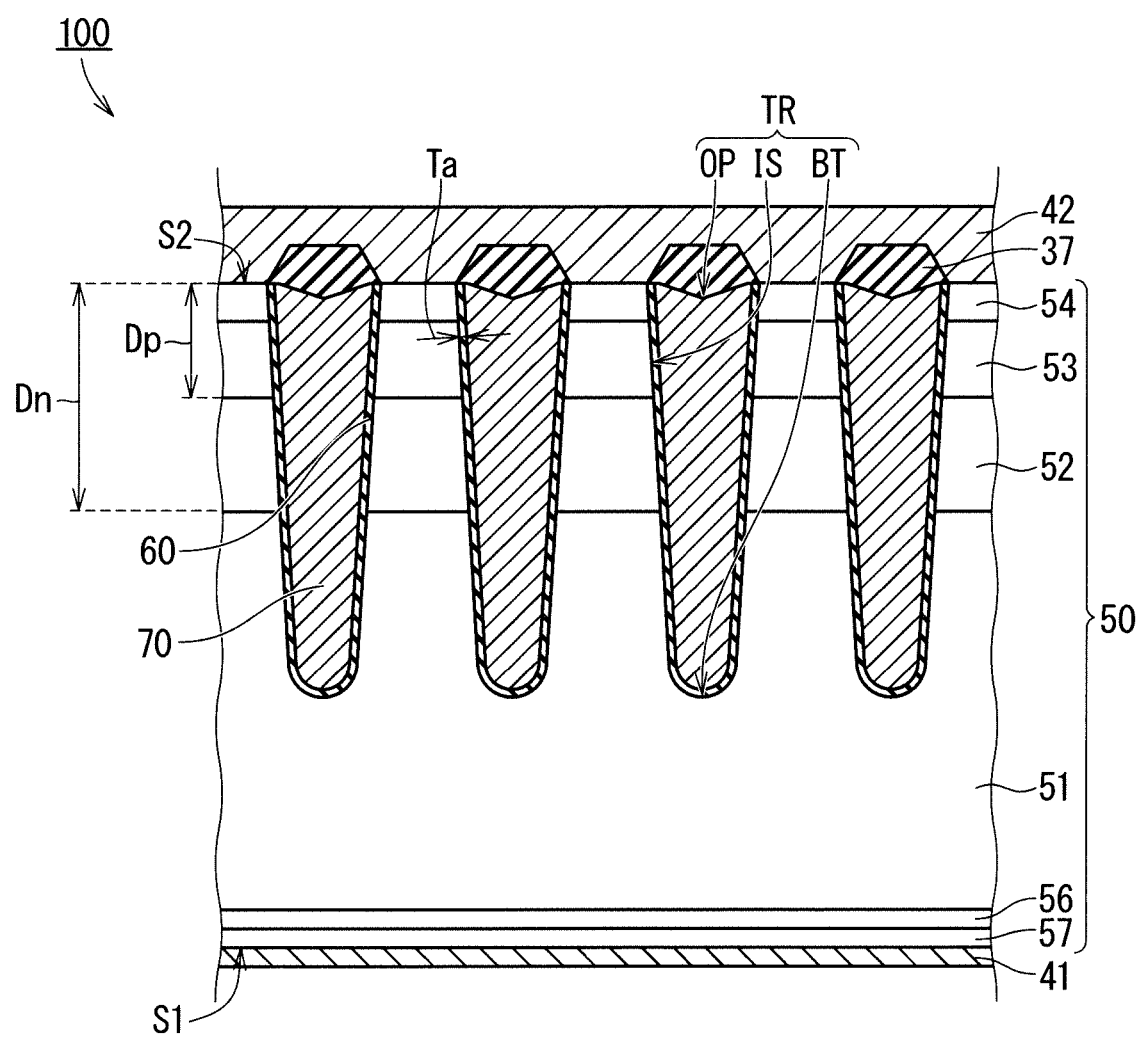
FIG. 7 is a partial cross-sectional view showing a configuration of a semiconductor device of a comparative example provided with an internal insulating film having a uniform thickness.

FIG. 7 is a partial cross-sectional view schematically showing a configuration of an IGBT 100 of a comparative example provided with an internal insulating film having a uniform thickness. An internal insulating film 60 of the IGBT 100 has a uniform thickness Ta. Therefore, in the comparison in the vicinity of a bottom part BT of a trench TR, the internal insulating film 60 (FIG. 7) of the IGBT 100 of the comparative example is thinner than the internal insulating film 61 (FIGS. 2A and 2B) of the IGBT 101 of the present preferred embodiment. As a result, the IGBT 100 of the comparative example has a larger gate-collector capacitance Cgc, and thus has larger switching loss.

Here, firstly, if the thickness Ta of the IGBT 100 is increased, the gate-collector capacitance Cgc decreases. However, this increases a threshold voltage of the IGBT. The voltage threshold is required to be within a specific range depending on the application of the IGBT. Therefore, freely optimizing the thickness Ta in order to reduce Cgc is generally not acceptable.

Secondly, if a width of the trench TR (lateral dimension in FIG. 7) is reduced, formation of the gate-collector capacitance Cgc in the vicinity of the bottom part BT of the trench TR can be suppressed. However, in that case, a process of filling a conductor into the trench TR in order to form the trench electrode 70 becomes difficult.

Thirdly, if a depth of the trench TR (vertical dimension in FIG. 7) is reduced, formation of the gate-collector capacitance Cgc on a side surface of the trench TR is suppressed. However, this method has limitations, and it is difficult to significantly reduce Cgc. This is because, if the depth of the trench TR is made shallower than a bottom surface of the carrier storage layer 52, the withstand voltage is lowered. This will be described below.

Figure 8:
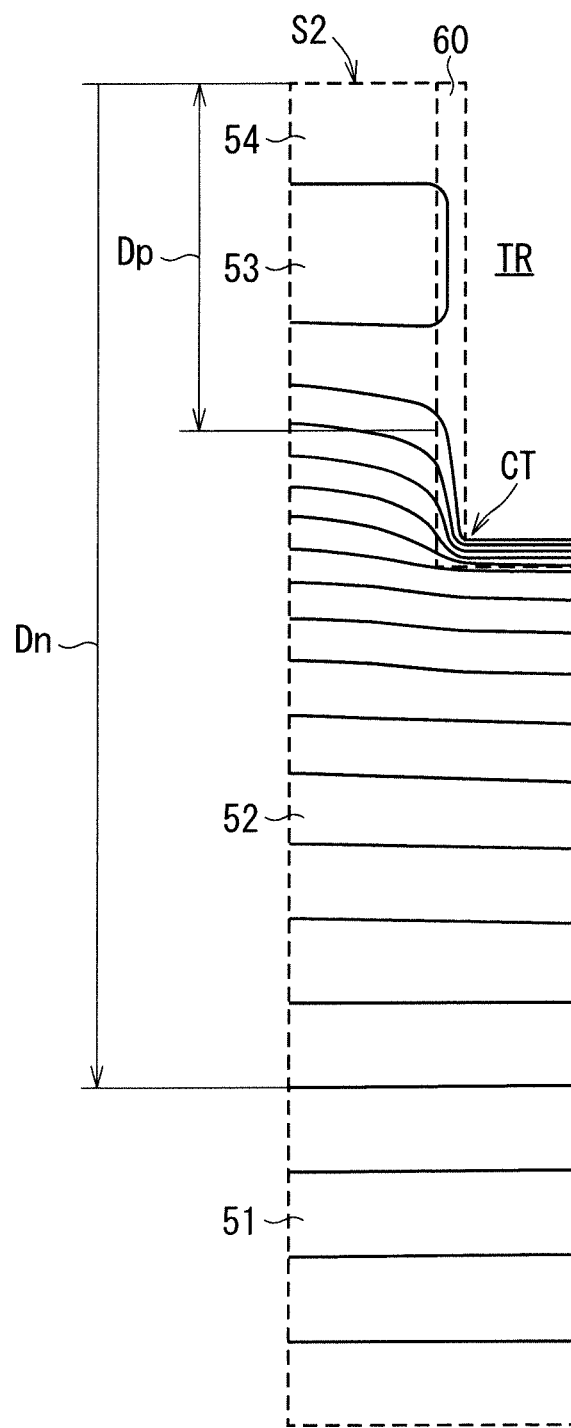
FIG. 8 is a partial cross-sectional view showing a simulation result of potential distribution in an OFF state, for a semiconductor device in which a depth of a trench is shallower than a bottom surface of a carrier storage layer.
Figure 9:
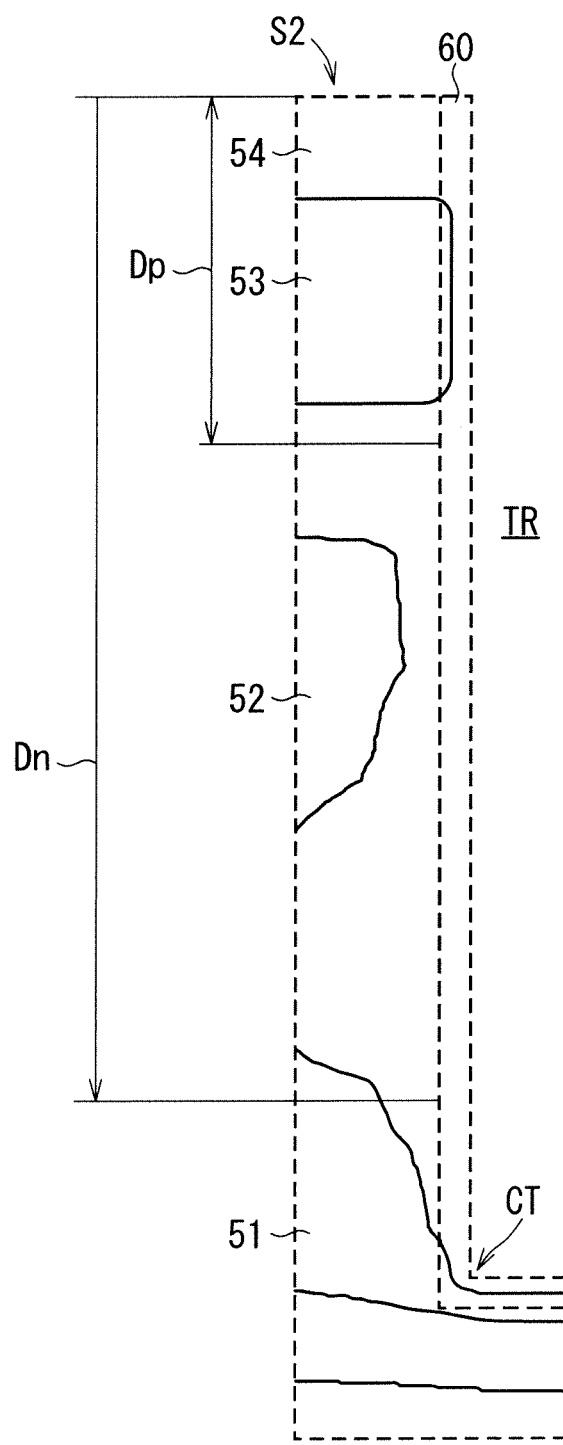
FIG. 9 is a partial cross-sectional view showing a simulation result of potential distribution in an OFF state, for a semiconductor device in which a depth of a trench is deeper than a bottom surface of a carrier storage layer.
Figure 10:
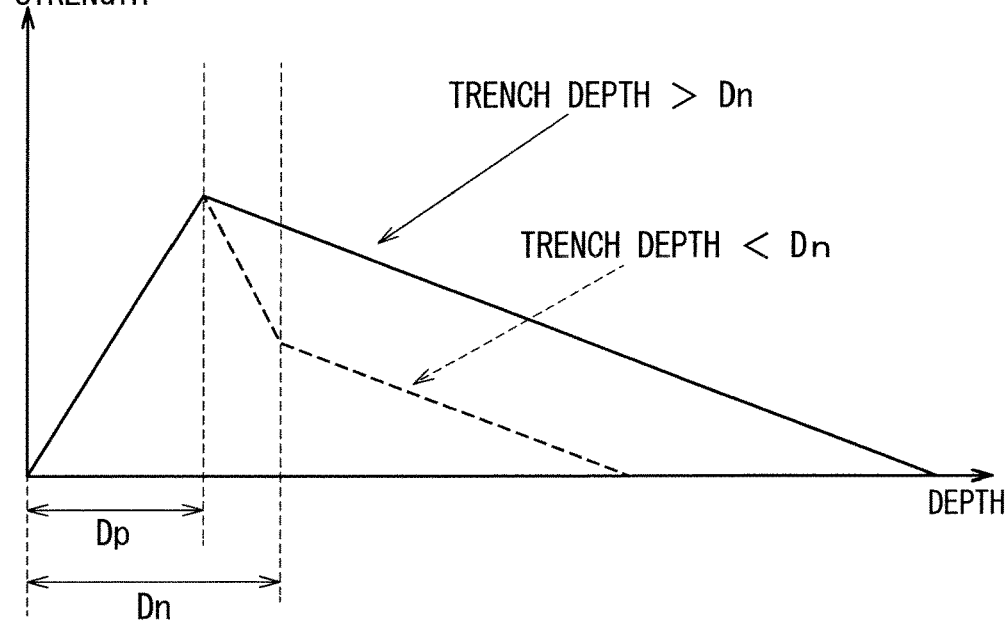
FIG. 10 is a graph schematically showing a relationship between a depth in the semiconductor substrate and an electric field strength, on the basis of results of FIGS. 8 and 9.

FIGS. 8 and 9 are partial cross-sectional views showing a simulation result of potential distribution in an OFF state, respectively in the cases where the depth of the trench TR is shallower and deeper than the depth Dn of the bottom surface of carrier storage layer 52. In the figure, contour lines represent potentials. When the trench TR is shallow, the contour lines are dense in the vicinity of the bottom part of the trench TR, particularly at a corner part CT, which means electric field concentration. FIG. 10 is a graph schematically showing a relationship between a depth in the semiconductor substrate and an electric field strength, on the basis of these simulation results. In general, a withstand voltage substantially corresponds to an integral value of the electric field strength in the depth direction. As can be seen from FIG. 10, when the depth of the trench TR is smaller than the depth Dn, the withstand voltage is significantly reduced.

(Summary of Effects)

According to the present preferred embodiment, the internal insulating film 61 (FIGS. 2A and 2B) has the thickness Ta at a portion facing the p base layer 53, has the thickness Tb at a portion facing the n⁻ drift layer 51, and has the thickness Ta and the thickness Tb at a portion facing the n carrier storage layer 52, and the thickness Tb is thicker than the thickness Ta. This reduces the gate-collector capacitance Cgc without affecting the voltage threshold characteristics of a channel formed by the p base layer 53. The reduction of Cgc can suppress switching loss of the IGBT.

The width Wbt (FIGS. 2A and 2B) of the trench TR at a depth of the deepest part of the trench electrode 70 is desirably smaller than the width Wop of the opening OP on the surface S2. This can reduce an area of a bottom surface of the trench TR while avoiding difficulty in a process of burying an electrode in the trench TR. By reducing the area of the bottom surface of the trench TR, the gate-collector capacitance Cgc is further reduced. Therefore, switching loss of the IGBT can be further suppressed.

Second Preferred Embodiment (Configuration)

Figure 11:
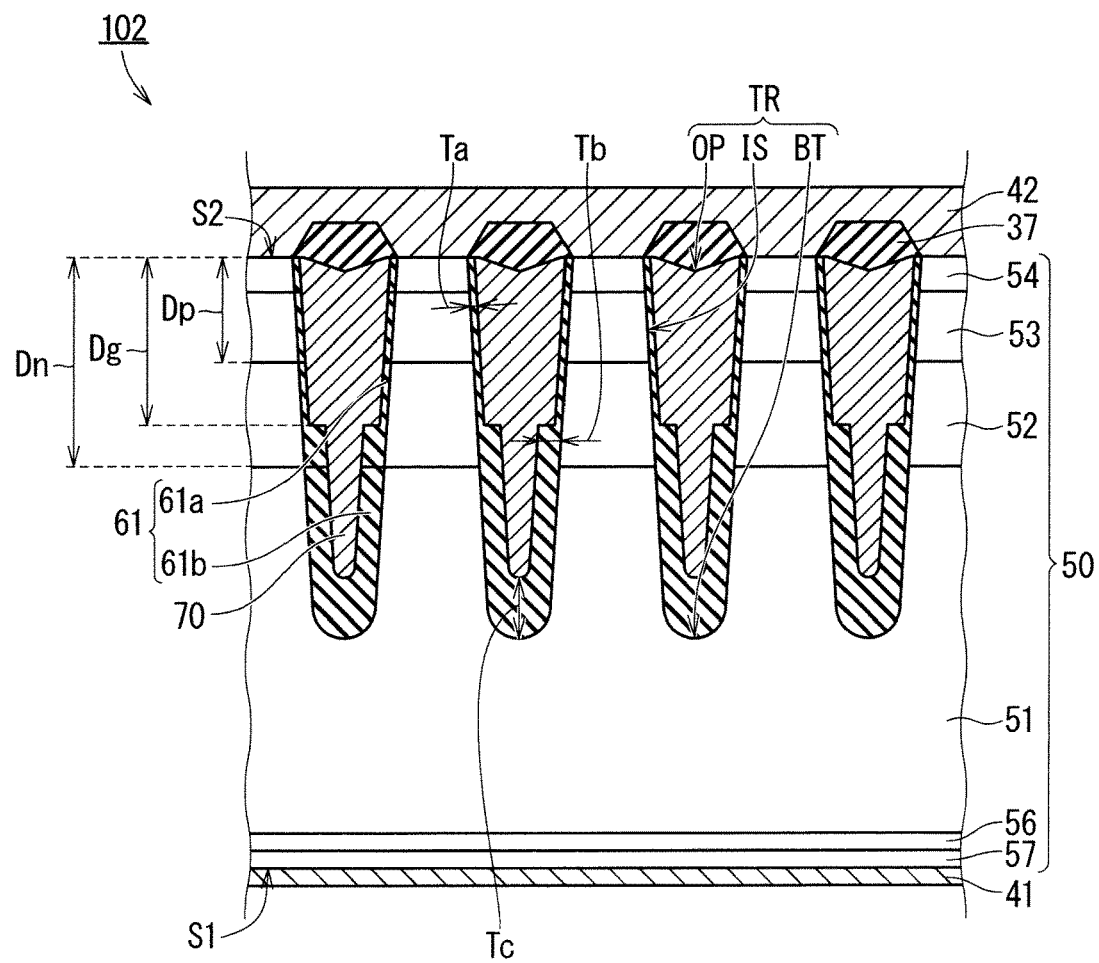
FIG. 11 is a partial cross-sectional view schematically showing a configuration of a semiconductor device in a second preferred embodiment of the present invention.

FIG. 11 is a partial cross-sectional view schematically showing a configuration of an IGBT 102 (semiconductor device) in a second preferred embodiment. Also in the IGBT 102, as in the IGBT 101 (FIGS. 2A and 2B: the first preferred embodiment), an internal insulating film 61 has a thickness Ta at a portion facing a p base layer 53, has a thickness Tb at a portion facing an n⁻ drift layer 51, and has the thickness Ta and the thickness Tb at a portion facing an n carrier storage layer 52, and the thickness Tb is thicker than the thickness Ta. Further, in the present preferred embodiment, a portion of the internal insulating film 61 deeper than the deepest part of a trench electrode 70 has a thickness Tc (third thickness) thicker than the thickness Tb. Specifically, a lower portion 61b of the internal insulating film 61 has the thickness Tc thicker than the thickness Tb on a bottom part BT of a trench TR.

Note that, in this specification, the "thickness" of the internal insulating film is defined as a dimension of the internal insulating film in a direction perpendicular to the inner surface of the trench. For example, in FIG. 11, in the bottom part BT of the trench TR, a dimension in a vertical direction corresponds to the thickness since a normal line of an inner surface IS is along the vertical direction. Further, at a certain distance from the bottom part BT, since the normal line of the inner surface IS is along a lateral direction (strictly speaking, a direction slightly inclined from the lateral direction), a dimension in the lateral direction (strictly speaking, a direction slightly inclined from the lateral direction) corresponds to the thickness.

Note that a configuration other than the above is substantially the same as the configuration of the first preferred embodiment described above, so that the same or corresponding elements are denoted by the same reference symbols and description thereof will not be repeated.

(Effect)

According to the present preferred embodiment, a portion of the internal insulating film 61 deeper than the deepest part of the trench electrode 70 has the thickness Tc thicker than the thickness Tb. This enables suppression of formation of the gate-collector capacitance Cgc in the vicinity of the bottom part BT of the trench TR, while avoiding difficulty of a process of burying the trench electrode 70 into the trench TR due to the internal insulating film 61 on the side surface of the trench TR. Therefore, it is possible to further suppress switching loss of the IGBT while using a practical manufacturing method.

Third Preferred Embodiment (Configuration)

Figure 12:
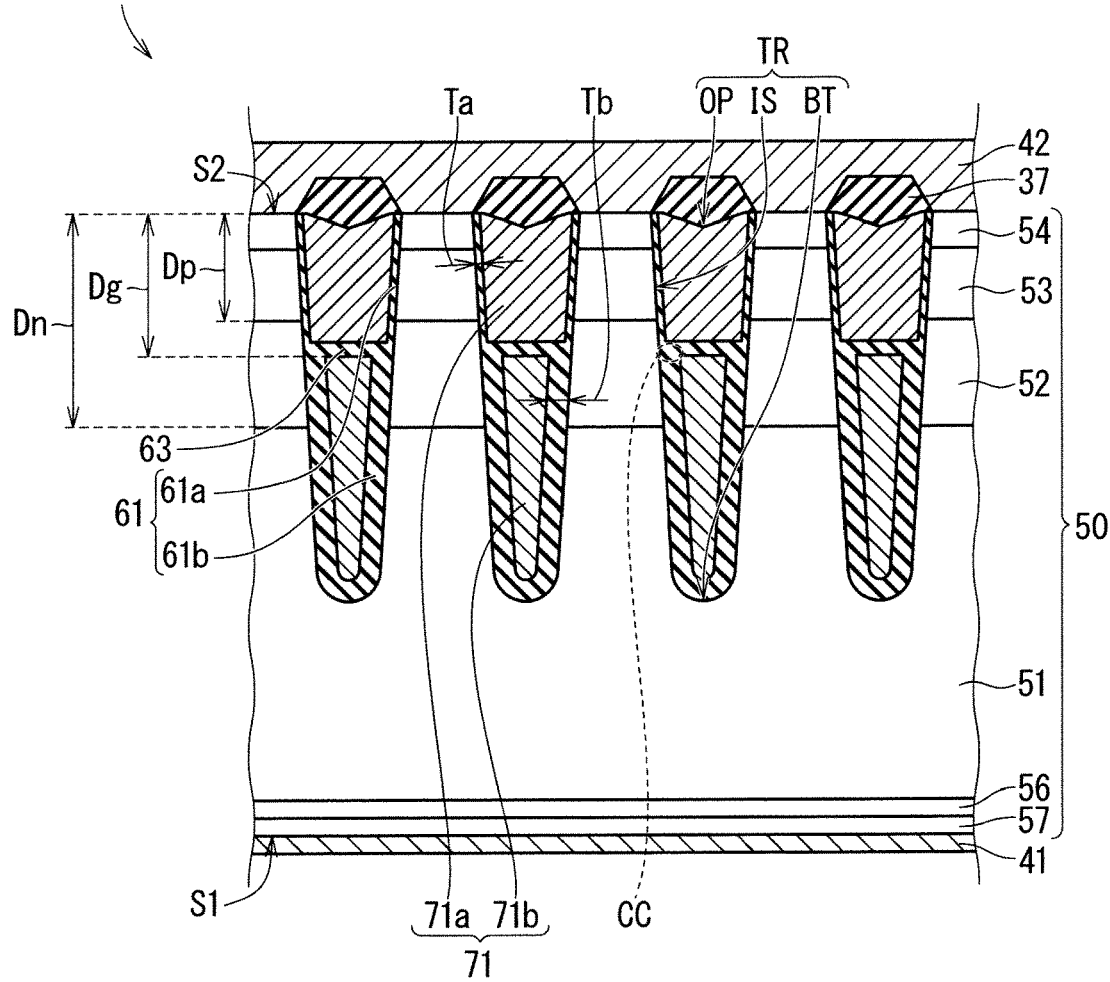
FIG. 12 is a partial cross-sectional view schematically showing a configuration of a semiconductor device in a third preferred embodiment of the present invention.

FIG. 12 is a partial cross-sectional view schematically showing a configuration of an IGBT 201 (semiconductor device) in a third preferred embodiment. The IGBT 201 has a trench electrode 71 instead of the trench electrode 70 (FIG. 1: the first preferred embodiment). The trench electrode 71 has an upper electrode 71a and a buried electrode 71b. The upper electrode 71a is in contact with a portion of an internal insulating film 61 having a thickness Ta. The buried electrode 71b is in contact with a portion of the internal insulating film 61 having a thickness Tb. Specifically, the trench electrode 71 has the upper electrode 71a disposed shallower than a depth Dg, and the buried electrode 71b disposed deeper than the upper electrode 71a. The IGBT 201 has an isolation insulating film 63 that separates the upper electrode 71a and the buried electrode 71b in a trench TR. In the present preferred embodiment, the buried electrode 71b is electrically connected to the upper electrode 71a having a function as a gate electrode. As a configuration for obtaining such an electrical connection, for example, a first modification of a seventh preferred embodiment described later is used. Note that a configuration other than this is substantially the same as the configuration of the first preferred embodiment described above, so that the same or corresponding elements are denoted by the same reference symbols and description thereof will not be repeated.

(Effect)

According to the present preferred embodiment, there is provided the isolation insulating film 63 to separate the upper electrode 71a and the buried electrode 71b in the trench TR. This enables suppression of formation of a gate-collector capacitance Cgc in the vicinity of a portion of an inner surface of the trench TR facing the isolation insulating film 63, that is, a broken line portion CC (FIG. 12). This enables further suppression of switching loss of IGBT.

The buried electrode 71b is electrically connected to the upper electrode 71a in the present preferred embodiment. This stabilizes a potential of the buried electrode 71b. Consequently, the characteristics of the IGBT can be stabilized.

(Modification)

In the present preferred embodiment, the buried electrode 71b is electrically connected to the upper electrode 71a, whereby a potential of the buried electrode 71b is set to a gate potential. As a modification, the potential of the buried electrode 71b may be set to a potential other than the gate potential.

As a first modification, the buried electrode 71b may be electrically connected to an emitter electrode 42 instead of the upper electrode 71a. In this case, the buried electrode 71b is electrically connected to an n⁺ emitter layer 54 (impurity layer) via the emitter electrode 42. As a result, the potential of the buried electrode 71b is set to an emitter potential. As a configuration for obtaining such an electrical connection, for example, the seventh preferred embodiment described later is used. According to this modification, the upper electrode 71a is shielded by the buried electrode 71b that is fixed to the emitter potential. Consequently, the gate-collector capacitance Cgc of the upper electrode 71a as the gate electrode is reduced. The reduction of Cgc can suppress switching loss of the IGBT.

As a second modification, the buried electrode 71b may be electrically floated. As a result, the potential of the buried electrode 71b is set to a floating potential. According to this modification, it is not required to provide a configuration for fixing the potential of the buried electrode 71b. Therefore, the configuration of the IGBT can be simplified.

Figure 13:
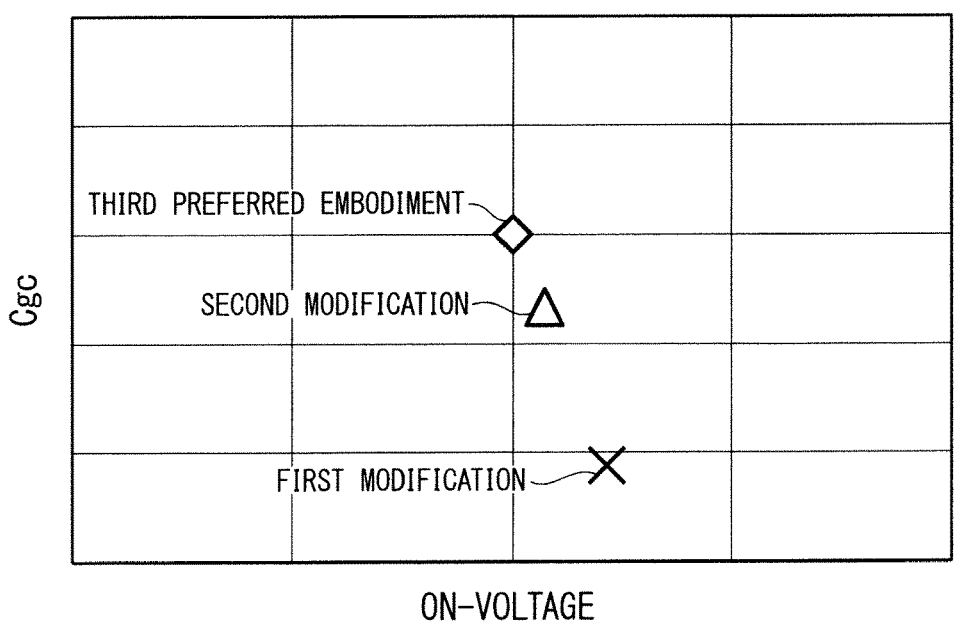
FIG. 13 is a graph showing an example of a relationship between an ON-voltage and a gate-collector capacitance Cgc in the third preferred embodiment and first and second modifications thereof of the present invention.

FIG. 13 is a graph showing an example of a relationship between an ON-voltage and a gate-collector capacitance Cgc in the third preferred embodiment and the first and second modifications thereof. From the viewpoint of reducing the gate-collector capacitance Cgc, the first modification, the second modification, and the present preferred embodiment are superior in this order. From the viewpoint of reducing the ON-voltage, the present preferred embodiment, the second modification, and the first modification are superior in this order.

Fourth Preferred Embodiment

Figure 14:
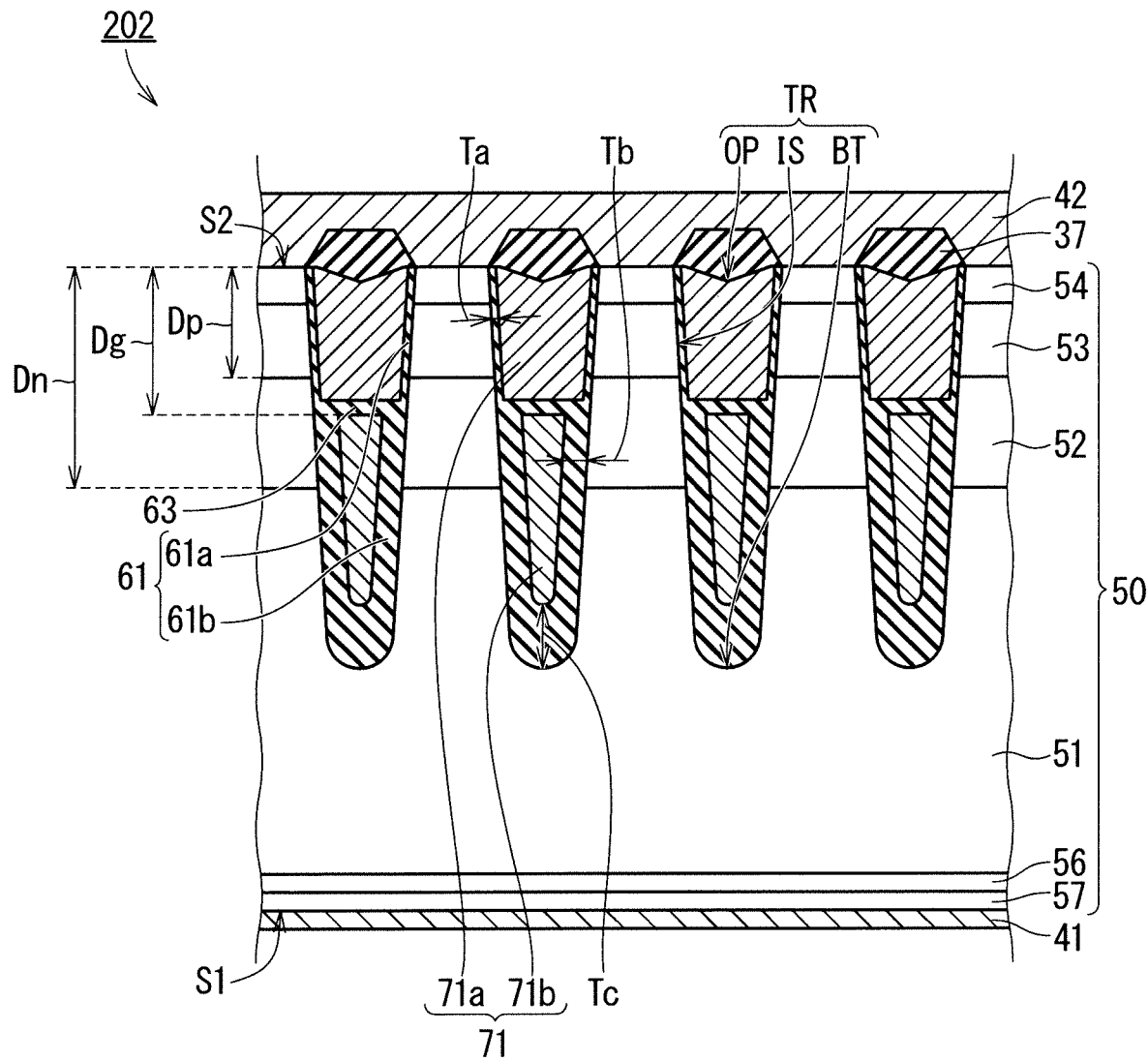
FIG. 14 is a partial cross-sectional view schematically showing a configuration of a semiconductor device in a fourth preferred embodiment of the present invention.

FIG. 14 is a partial cross-sectional view schematically showing a configuration of an IGBT 202 (semiconductor device) in a fourth preferred embodiment. Also in the IGBT 202, as in the IGBT 201 (FIG. 12: the second preferred embodiment), an internal insulating film 61 has a thickness Ta at a portion facing a p base layer 53, has a thickness Tb at a portion facing an n⁻ drift layer 51, and has the thickness Ta and the thickness Tb at a portion facing an n carrier storage layer 52, and the thickness Tb is thicker than the thickness Ta. Further, in the present preferred embodiment, a portion of the internal insulating film 61 deeper than the deepest part of a trench electrode 70 has a thickness Tc (third thickness) thicker than the thickness Tb. Specifically, a lower portion 61*b* of the internal insulating film 61 has the thickness Tc thicker than the thickness Tb on a bottom part BT of a trench TR. A configuration other than this is substantially the same as the configuration of the third preferred embodiment described above, so that the same or corresponding elements are denoted by the same reference symbols and description thereof will not be repeated.

According to the present preferred embodiment, an effect similar to the effect of the second preferred embodiment can be obtained. Specifically, it is possible to suppress formation of a gate-collector capacitance Cgc in the vicinity of the bottom part BT of the trench TR, while avoiding difficulty of a process of burying the trench electrode 70 into the trench TR due to the internal insulating film 61 on the side surface of the trench TR. Therefore, switching loss of the IGBT can be further suppressed.

Fifth Preferred Embodiment

FIG. 15 is a partial cross-sectional view schematically showing a configuration of an IGBT 203 (semiconductor device) in a fifth preferred embodiment. The IGBT 203 has a buried electrode 73*b* instead of the buried electrode 71*b* (FIG. 12: third preferred embodiment). The buried electrode 73*b* has: an upper surface Pu on a surface S2 side; a side surface Ps facing an n⁻ drift layer 51 and an n carrier storage layer 52; and an angular surface Pc disposed between the upper surface Pu and the side surface Ps and inclined from each of the upper surface Pu and the side surface Ps. The upper surface Pu faces an opening OP of a trench TR, and the side surface Ps faces an inner surface IS of the trench TR. From another point of view, a corner part formed by the upper surface Pu and the side surface Ps is rounded, and a thickness of an internal insulating film 61 is locally increased near the corner part. Note that a configuration other than this is substantially the same as the configuration of the third or fourth preferred embodiment described above, so that the same or corresponding elements are denoted by the same reference symbols and description thereof will not be repeated.

According to the present preferred embodiment, a sharpness of the corner part of the buried electrode 73*b* can be suppressed. Thus, concentration of the electric field at the corner part of the buried electrode 73*b* can be suppressed. This allows improvement of the withstand voltage of the IGBT.

Sixth Preferred Embodiment

Figure 16:
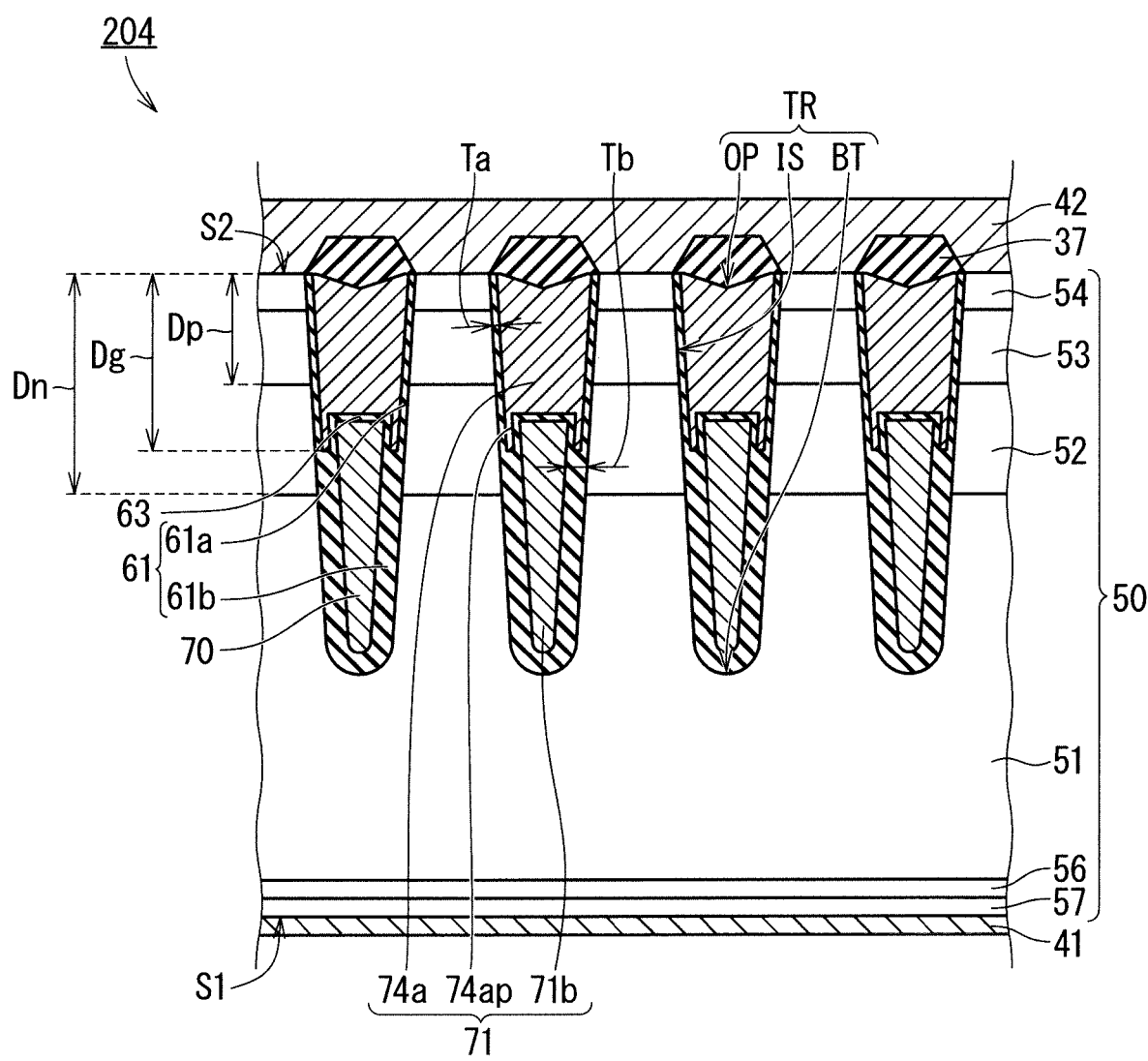
FIG. 16 is a partial cross-sectional view schematically showing a configuration of a semiconductor device in a sixth preferred embodiment of the present invention.

FIG. 16 is a partial cross-sectional view schematically showing a configuration of an IGBT 204 (semiconductor device) in a sixth preferred embodiment. The IGBT 204 has an upper electrode 74*a* instead of the upper electrode 71*a* (FIG. 12: third preferred embodiment). The upper electrode 74*a* has a protruding portion 74*ap*. The protruding portion 74*ap* is opposed to a buried electrode 71*b* via an isolation insulating film 63 in an in-plane direction (lateral direction in FIG. 16) of a semiconductor substrate 50. An upper corner part (end part of an upper surface) of the buried electrode 71*b* is covered with the upper electrode 74*a* via the isolation insulating film 63. The protruding portion 74*ap* desirably extends to a depth Dg, from a location deeper than a depth Dp and shallower than the depth Dg. Note that a configuration other than this is substantially the same as the configuration of the third or fourth preferred embodiment described above, so that the same or corresponding elements are denoted by the same reference symbols and description thereof will not be repeated.

According to the present preferred embodiment, the upper electrode 74*a* having the protruding portion 74*ap* enhances capacitive coupling between the buried electrode 71*b* and the upper electrode 74*a*. This can stabilize a potential of the buried electrode 71*b* to some extent, even when the buried electrode 71*b* is in a floating state. Consequently, the characteristics of the IGBT can be stabilized.

Note that "when the buried electrode 71*b* is in a floating state" is not limited to a case where an electrical path for fixing a potential of the buried electrode 71*b* is intentionally not provided, but also includes a case where the electrical path was provided at the time of manufacture but the electrical path has been disconnected by some cause thereafter. Since it is not possible to reliably predict the disconnection, it is effective to apply the present preferred embodiment in preparation for disconnection that may occur in the future, even in a case where the electrical path is provided.

Seventh Preferred Embodiment (Configuration)

Figure 17:
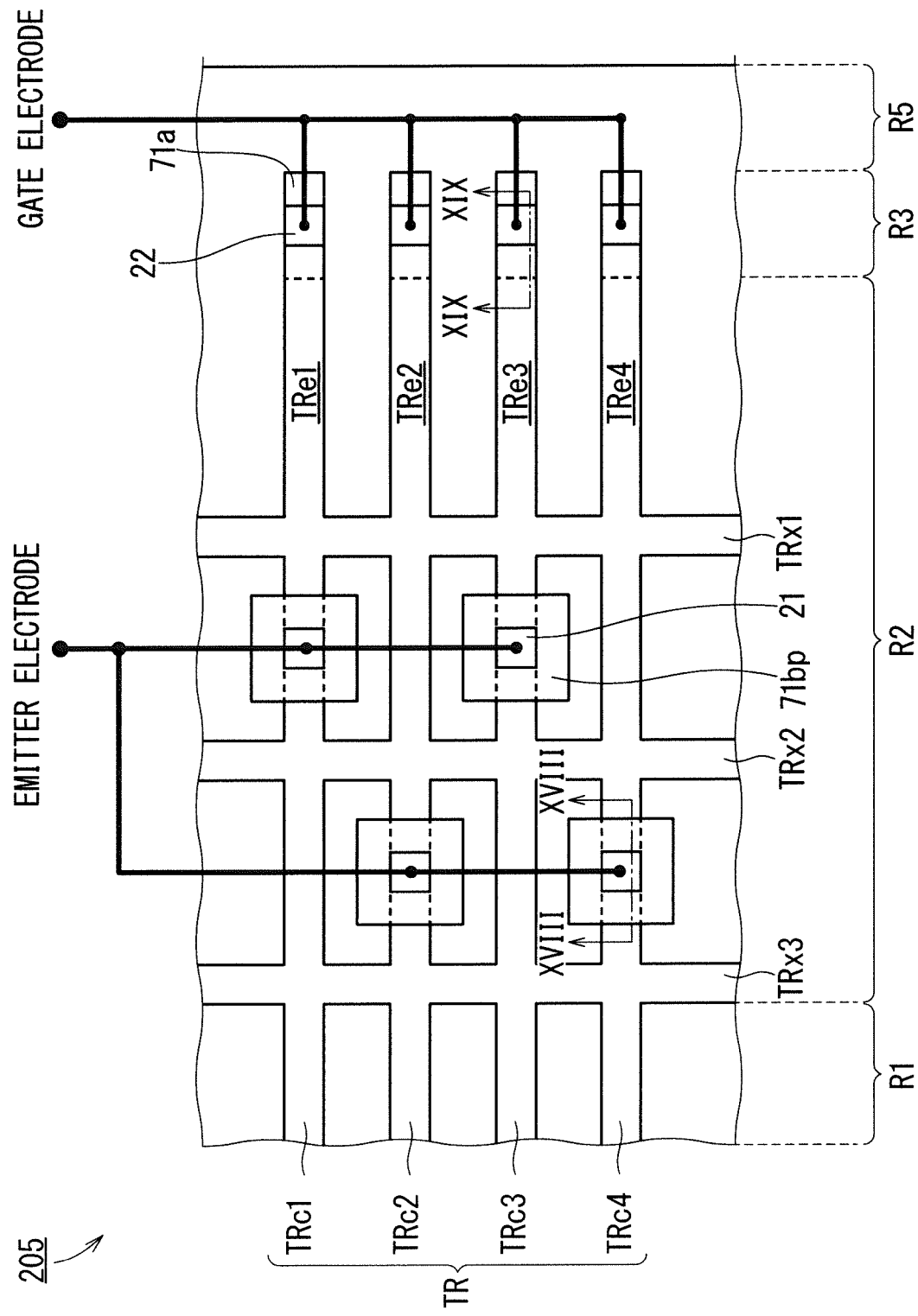
FIG. 17 is a partial top view schematically showing a configuration of a semiconductor device in a seventh preferred embodiment of the present invention.
Figure 18:
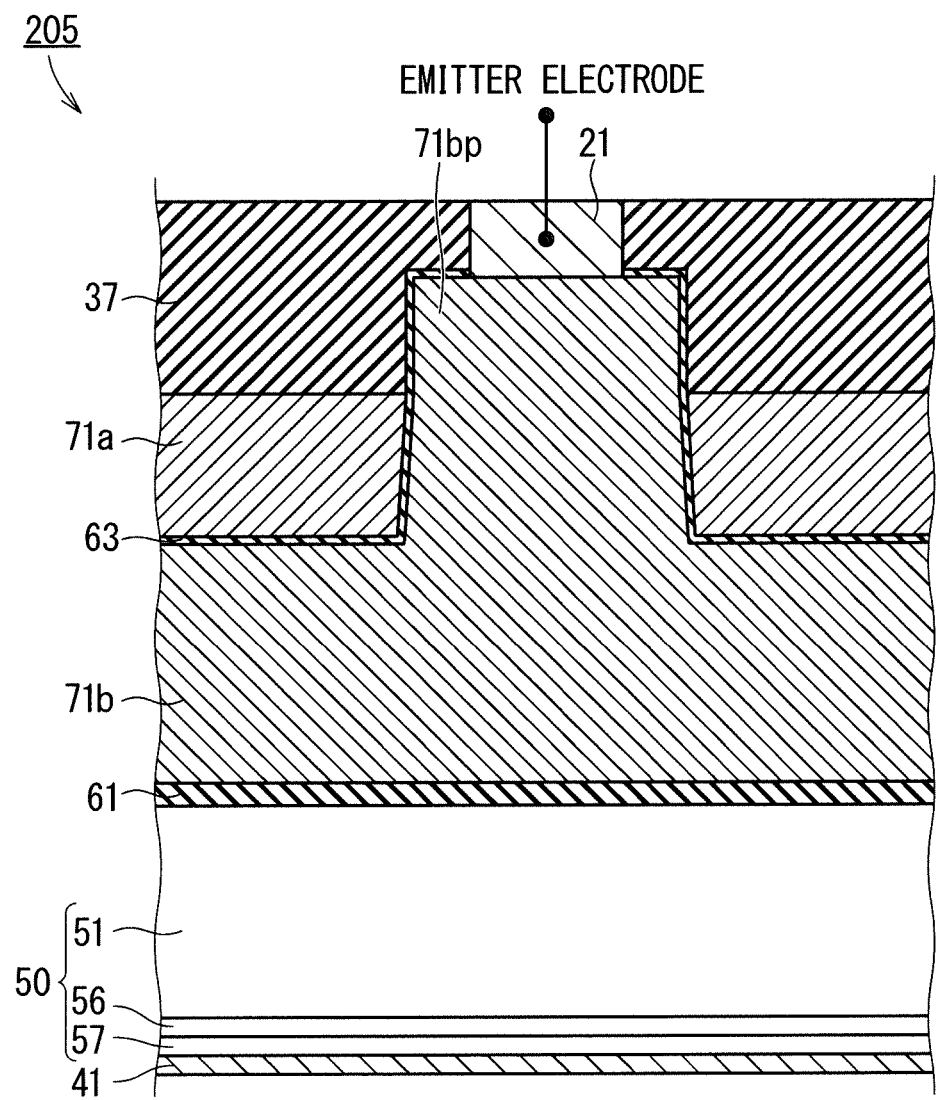
FIG. 18 is a partial cross-sectional view along line XVIII-XVIII in FIG. 17.
Figure 19:
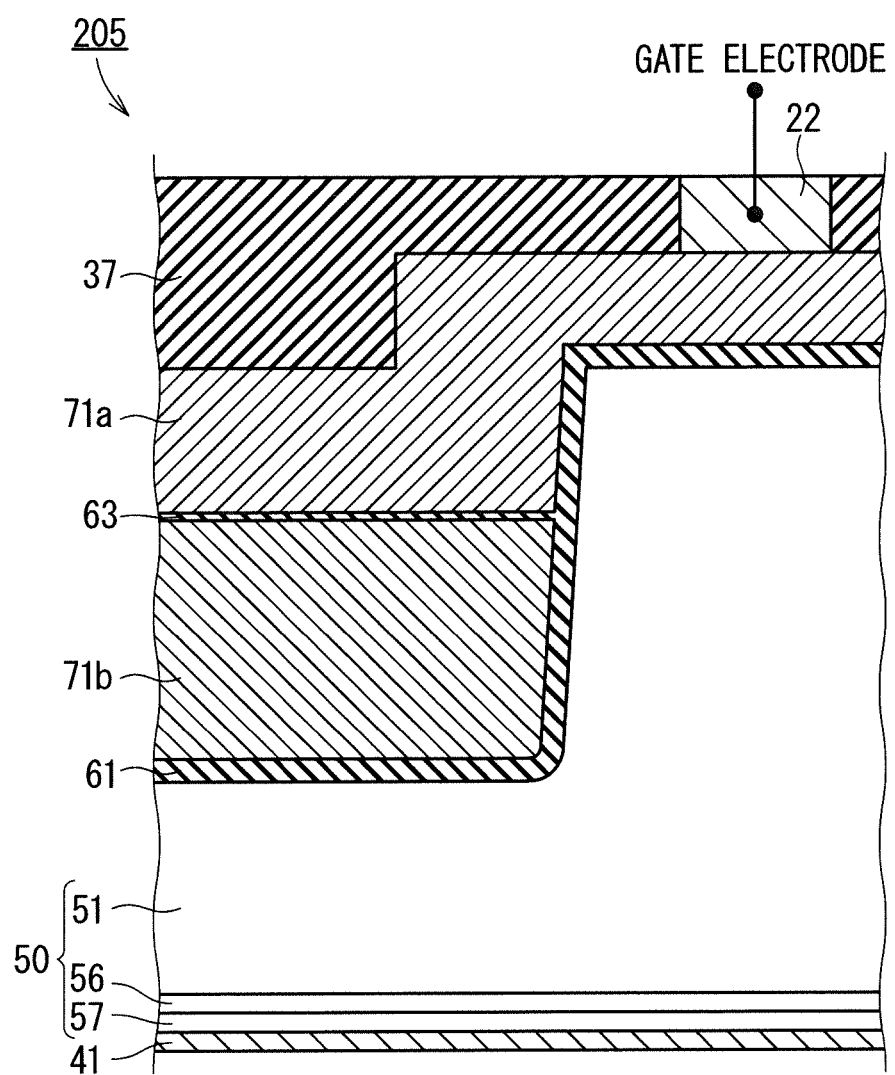
FIG. 19 is a partial cross-sectional view along line XIX-XIX in FIG. 17.

FIG. 17 is a partial top view schematically showing a configuration of an IGBT 205 (semiconductor device) in the seventh preferred embodiment. FIGS. 18 and 19 respectively are partial cross-sectional views along line XVIII-XVIII and line XIX-XIX of FIG. 17. Note that, in FIG. 17, some members are not illustrated in order to make the drawing easily viewable.

A semiconductor substrate 50 is segmented into, as a planar layout, a cell region R1, an electrode wiring region R2, a gate wiring region R3, and a termination region R5. The electrode wiring region R2 is disposed between the cell region R1 and the gate wiring region R3. The gate wiring region R3 is for applying a gate potential to an upper electrode 71*a*. The electrode wiring region R2 is for applying an emitter potential to a buried electrode 71*b* in the present preferred embodiment. In the cell region R1 (FIG. 17), a trench TR has cell trench parts TRc1 to TRc4. The cell trench parts TRc1 to TRc4 are adjacent to each other, and each extends linearly. In FIG. 17, each of the cell trench parts TRc1 to TRc4 extends in a lateral direction.

The electrode wiring region R2 is provided with extension trench parts TRe1 to TRe4 and crossing trench parts TRx1 to TRx3. Each of the extension trench parts TRe1 to TRe4 linearly extends. In FIG. 17, each of the extension trench parts TRe1 to TRe4 extends in the lateral direction. The extension trench parts TRe1 to TRe4 are adjacent to each other. Each of the extension trench parts TRe1 to TRe4 is extended from the cell trench parts TRc1 to TRc4. The extension trench parts TRe1 to TRe4 reach the gate wiring region R3. Each of the crossing trench parts TRx1 to TRx3 extends in a direction crossing the extension trench parts TRe1 to TRe4, specifically, in a vertical direction in FIG. 17. In the present preferred embodiment, each of the crossing trench parts TRx1 to TRx3 intersects with the extension trench parts TRe1 to TRe4, and is orthogonal in the drawing. The crossing trench parts TRx1 to TRx3 are adjacent to each other.

In at least one of the extension trench parts TRe1 to TRe4, between the crossing trench parts TRx1 to TRx3, the buried electrode 71b has a protrusion 71bp being convex toward an opening OP of the trench TR (upward in FIG. 18) and penetrating the upper electrode 71a. The protrusion 71bp locally protrudes toward the opening OP of the trench TR (upward in FIG. 18). Note that the protrusion 71bp and the upper electrode 71a are insulated by an isolation insulating film 63.

In the present preferred embodiment, all of the extension trench parts TRe1 to TRe4 have the protrusion 71bp. In other words, each of the extension trench parts TRe1 to TRe4 has the protrusion 71bp. The crossing trench parts TRx1 to TRx3 form a first region sandwiched by the crossing trench parts TRx1 and TRx2 adjacent to each other, and a second region sandwiched by the crossing trench parts TRx2 and TRx3 adjacent to each other. The protrusion 71bp provided in each of the extension trench parts TRe1 to TRe4 is exclusively provided in one of the first and second regions. Further, each of the first and second regions is provided with at least one protrusion 71bp. Desirably, as shown in FIG. 17, the protrusions 71bp provided in the extension trench parts TRe1 to TRe4 are alternately arranged in the first and second regions.

On the protrusion 71bp, a contact 21 made of a conductor is provided in contact with the protrusion 71bp. The contact 21 is electrically connected to an emitter electrode 42. In other words, an emitter potential is applied to the contact 21. For this purpose, the contact 21 may be a part of the emitter electrode 42, or may be a member in contact with the emitter electrode 42.

One end (right end in FIG. 17) of the extension trench parts TRe1 to TRe4 is located at a boundary between the electrode wiring region R2 and the gate wiring region R3. The upper electrode 71a extending in the extension trench parts TRe1 to TRe4 in the electrode wiring region R2 extends further into the gate wiring region R3, from the boundary between the electrode wiring region R2 and the gate wiring region R3. Consequently, the upper electrode 71a extends out of the extension trench parts TRe1 to TRe4 at the boundary. As a result, electrical connection with the upper electrode 71a can be easily obtained in the gate wiring region R3. For this electrical connection, a contact 22 made of a conductor is provided in contact with the upper electrode 71a in the gate wiring region R3. The contact 22 is electrically connected to a gate wiring layer 46 (FIG. 1). In other words, a gate potential is applied to the contact 22. For this purpose, the contact 22 may be a part of the gate wiring layer 46 or may be a member in contact with the gate wiring layer 46.

Note that a configuration other than this is substantially the same as the configuration of the third to sixth preferred embodiments described above, so that the same or corresponding elements are denoted by the same reference symbols and description thereof will not be repeated.

(Effect)

According to the present preferred embodiment, a potential of the buried electrode 71b can be fixed to the emitter potential by electrical connection with the buried electrode 71b via the protrusion 71bp. Since the protrusion 71bp is disposed in the electrode wiring region R2 between the cell region R1 and the gate wiring region R3, in a planar layout, the protrusion 71bp does not overlap with the structure provided in the gate wiring region R3 for applying the gate potential to the upper electrode 71a. This can avoid formation of an excessive step due to overlapping of the wires.

Since all of the extension trench parts TRe1 to TRe4 have the protrusion 71bp, the potential of the buried electrode 71b can be more sufficiently stabilized.

(First Modification)

In this modification, the contact 21 (FIG. 18) is electrically connected to the upper electrode 71a as a gate electrode, instead of the emitter electrode. In other words, a gate potential is applied to the contact 21. For this purpose, the contact 21 may be a part of the gate wiring layer 46 (FIG. 1) or may be a member in contact with the gate wiring layer 46. Also according to this modification, electrical connection with the buried electrode 71b via the protrusion 71bp can fix the potential of the buried electrode 71b.

(Second Modification)

Figure 20:
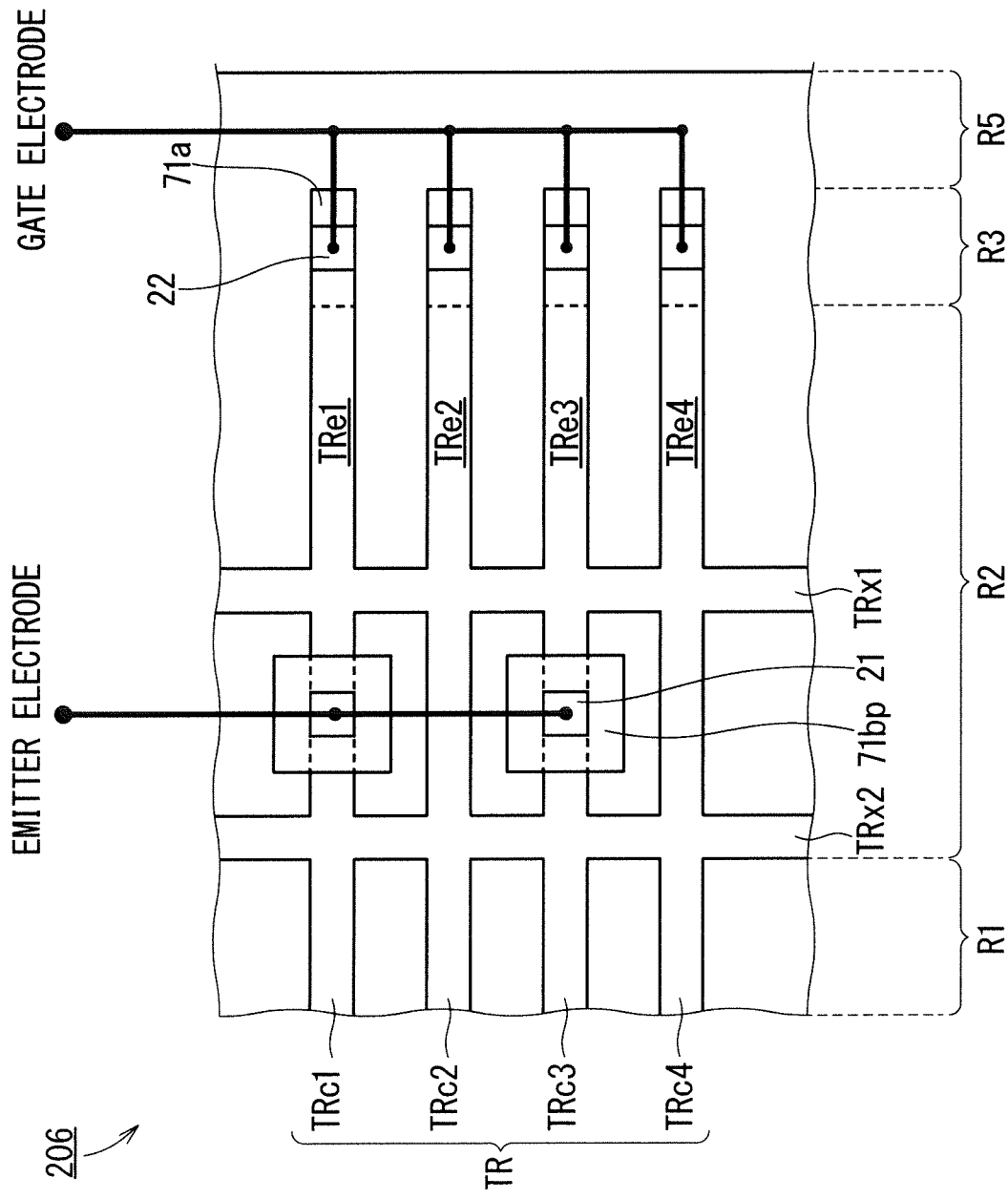
FIG. 20 is a partial top view schematically showing a configuration of a semiconductor device in a modification of the seventh preferred embodiment of the present invention.

FIG. 20 is a partial top view schematically showing a configuration of an IGBT 206 (semiconductor device) according to a modification of the seventh preferred embodiment. Note that, in FIG. 20, some members are not illustrated in order to make the drawing easily viewable. In this modification, some of the extension trench parts TRe1 to TRe4 exclusively has the protrusion 71bp. In the drawing, among the extension trench parts TRe1 to TRe4, the extension trench part TRe1 and the extension trench part TRe3 alone have the protrusion 71bp. As a result, the crossing trench part TRx3 may be omitted among the crossing trench parts TRx1 to TRx3 (FIG. 17). Consequently, a width (lateral dimension in FIG. 20) of the electrode wiring region R2 can be reduced. Thus, an effective area of the IGBT can be increased.

Eighth Preferred Embodiment (Configuration)

Figure 21:
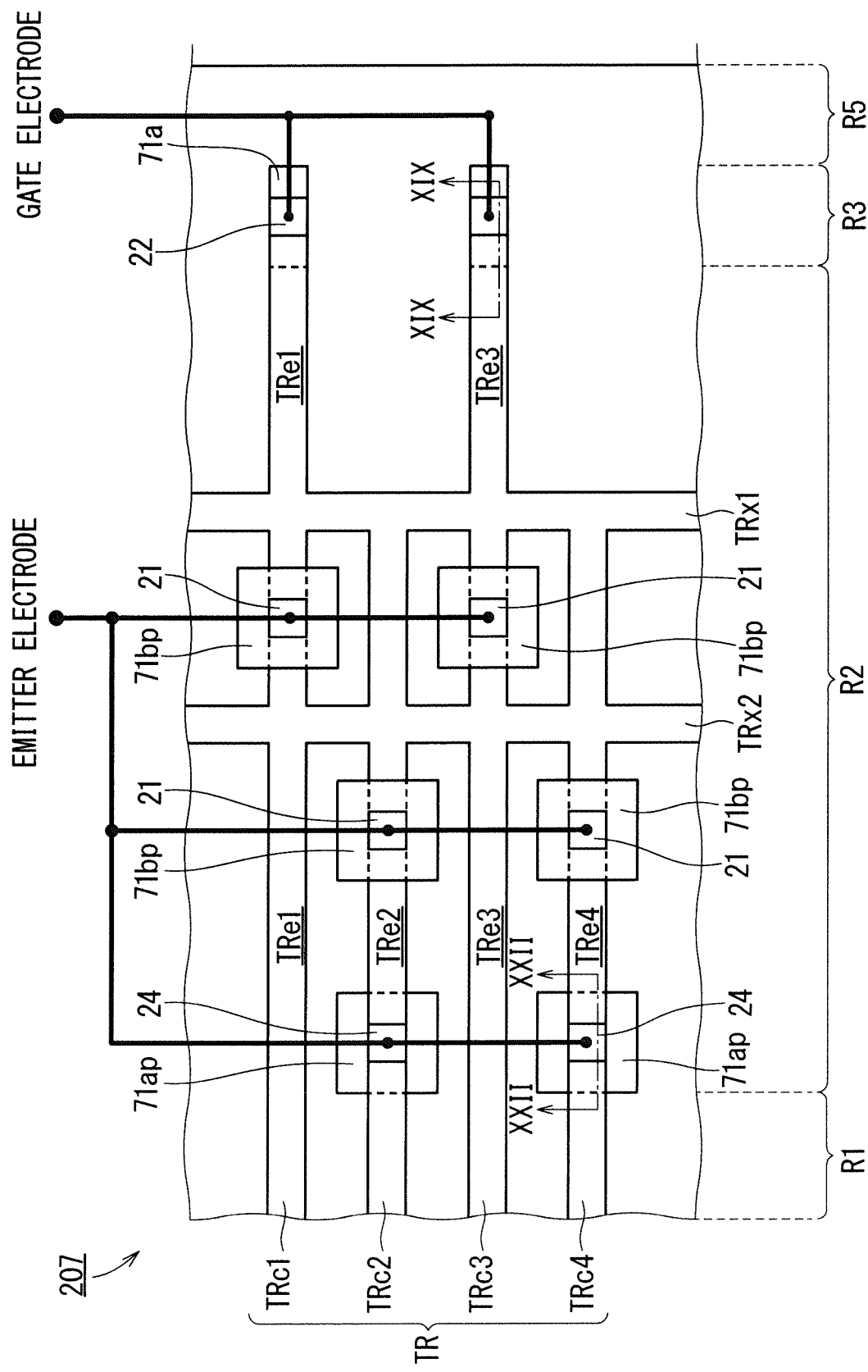
FIG. 21 is a partial top view schematically showing a configuration of a semiconductor device in an eighth preferred embodiment of the present invention.
Figure 22:
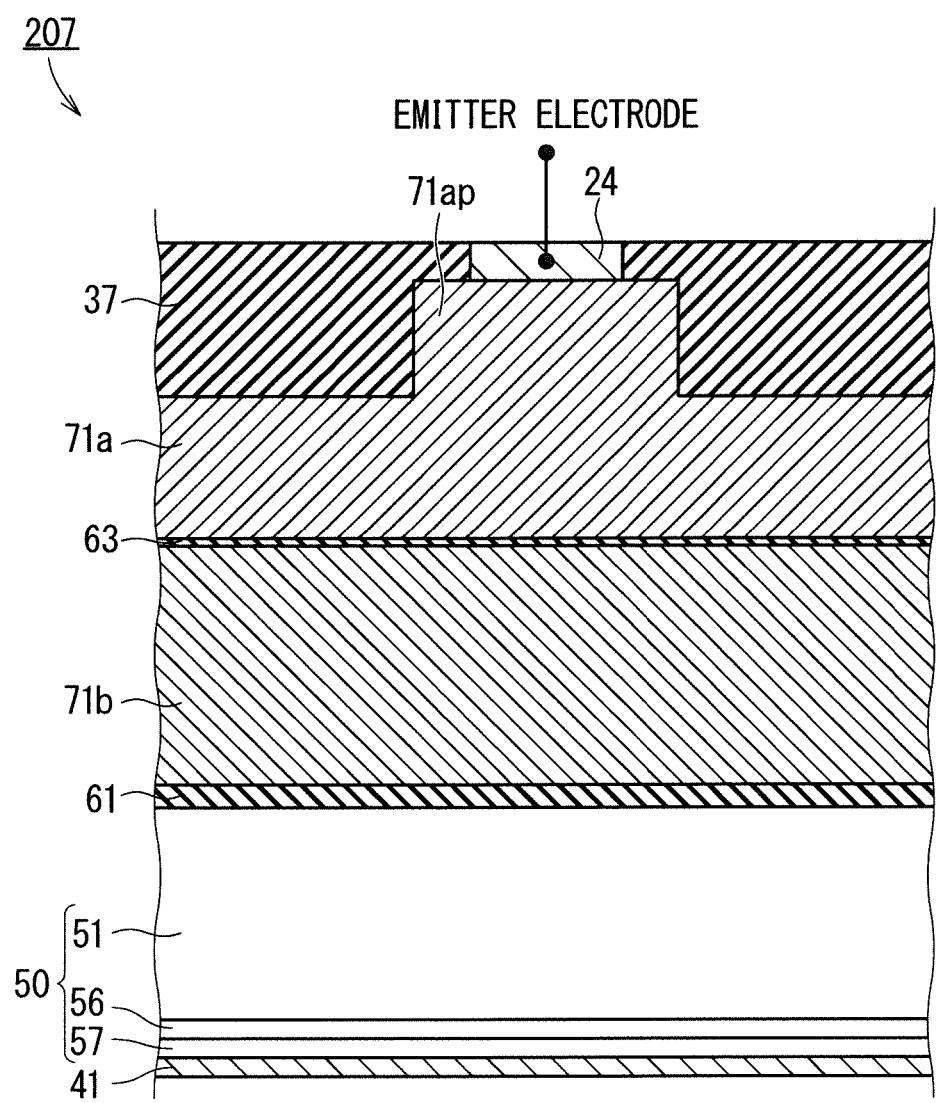
FIG. 22 is a partial cross-sectional view along line XXII-XXII in FIG. 21.

FIG. 21 is a partial top view schematically showing a configuration of an IGBT 207 (semiconductor device) in an eighth preferred embodiment. FIG. 22 is a partial cross-sectional view along line XXII-XXII of FIG. 21. A partial cross-sectional view along line XIX-XIX in FIG. 21 is similar to FIG. 19 described above. Note that, in FIG. 21, some members are not illustrated in order to make the drawing easily viewable.

A semiconductor substrate 50 is segmented into, as a planar layout, a cell region R1, an electrode wiring region R2, a gate wiring region R3, and a termination region R5. The electrode wiring region R2 is disposed between the cell region R1 and the gate wiring region R3. In the present preferred embodiment, the gate wiring region R3 is for applying a gate potential to a part (first portion) of an upper electrode 71a. In the present preferred embodiment, the electrode wiring region R2 is for electrically connecting a part (second portion) of the upper electrode 71a to an emitter electrode 42 (main electrode).

The electrode wiring region R2 is provided with extension trench parts TRe1 to TRe4 and crossing trench parts TRx1 and TRx2. Each of the extension trench parts TRe1 to TRe4 linearly extends. The extension trench parts TRe1 to TRe4 are adjacent to each other. Each of the extension trench parts TRe1 to TRe4 is extended from the cell trench parts TRc1 to TRc4. Some of the extension trench parts TRe1 to TRe4, specifically, the extension trench parts TRe1 and TRe3 reach the gate wiring region R3. Each of the crossing trench parts TRx1 and TRx2 extends in a direction crossing the extension trench parts TRe1 to TRe4, specifically, in a vertical direction in FIG. 21. In the present preferred embodiment, the crossing trench part TRx2 intersects with the extension trench parts TRe1 to TRe4. The crossing trench part TRx1 intersects with the extension trench parts TRe1 and TRe3, and is in contact with an end of the extension trench parts TRe2 and TRe4. The crossing trench parts TRx1 and TRx2 are adjacent to each other.

The extension trench parts TRe1 to TRe4 include the extension trench parts TRe1 and TRe3 (at least one first trench part) and the extension trench parts TRe2 and TRe4 (at least one second trench part). The upper electrode 71a in the extension trench parts TRe1 and TRe3 is electrically connected to a contact 22 in the gate wiring region R3. The upper electrode 71a in the extension trench parts TRe2 and TRe4 is electrically connected to the emitter electrode 42 via a contact 24. In the extension trench parts TRe2 and TRe4 (second trench parts), a buried electrode 71b has a protrusion 71bp between the cell region R1 and the crossing trench part TRx2 that is the closest to the cell region R1 out of the crossing trench parts TRx1 and TRx2. The protrusion 71bp is convex toward an opening OP of the trench TR (upward in FIG. 18) and penetrates the upper electrode 71a as described above in the seventh preferred embodiment. Further, the protrusion 71bp separates the upper electrode 71a by locally projecting toward the opening OP of the trench TR. Between the protrusion 71bp and the cell region R1, the IGBT 207 has the contact 24 (FIG. 22) on the upper electrode 71a. The contact 24 is electrically connected to an n+ emitter layer 54 (impurity layer). In other words, the contact 24 is electrically connected to the emitter electrode 42. In order to obtain this electrical connection, typically a short circuit, the contact 24 may be a part of the emitter electrode 42, or may be a member in electrical contact with the emitter electrode 42.

Note that a configuration other than this is substantially the same as the configuration of the seventh preferred embodiment or the modification thereof described above, so that the same or corresponding elements are denoted by the same reference symbols and description thereof will not be repeated.

(Effect)

According to the present preferred embodiment, in the extension trench parts TRe2 and TRe4 (second trench parts), the upper electrode 71a is electrically separated from the gate wiring region R3 by the protrusion 71bp (FIG. 18). The separated portion is electrically connected (typically short-circuited) to the n+ emitter layer 54 by the contact 24 (FIG. 22) provided on the separated portion. With this configuration, a potential of the upper electrode 71a in the extension trench parts TRe2 and TRe4 is fixed to an emitter potential. Therefore, the upper electrode 71a in the extension trench parts TRe2 and TRe4 loses a function as a gate electrode. As a result, a pitch of part of the trench TR functioning as a gate trench can be made larger than a pitch of the trench TR. Consequently, a gate capacitance can be reduced without widening the pitch of the trench TR. As a result, as described below, while improving switching characteristics by reducing the gate capacitance, it is possible to avoid decrease in withstand voltage due to an excessive trench pitch.

Figure 23:
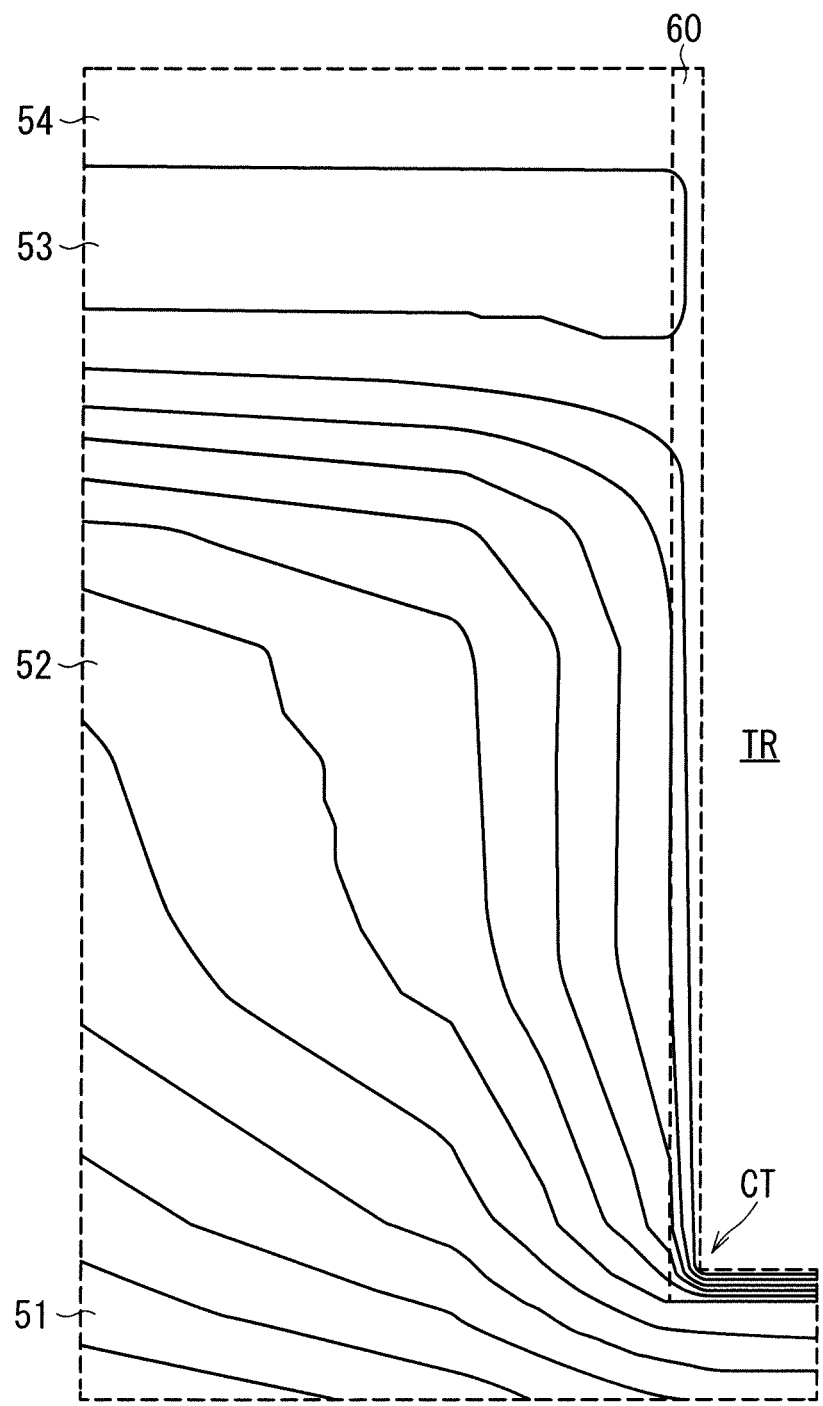
FIG. 23 is a partial cross-sectional view showing a simulation result of potential distribution in an OFF state when a trench pitch is wider than that in a case of FIG. 24.
Figure 24:
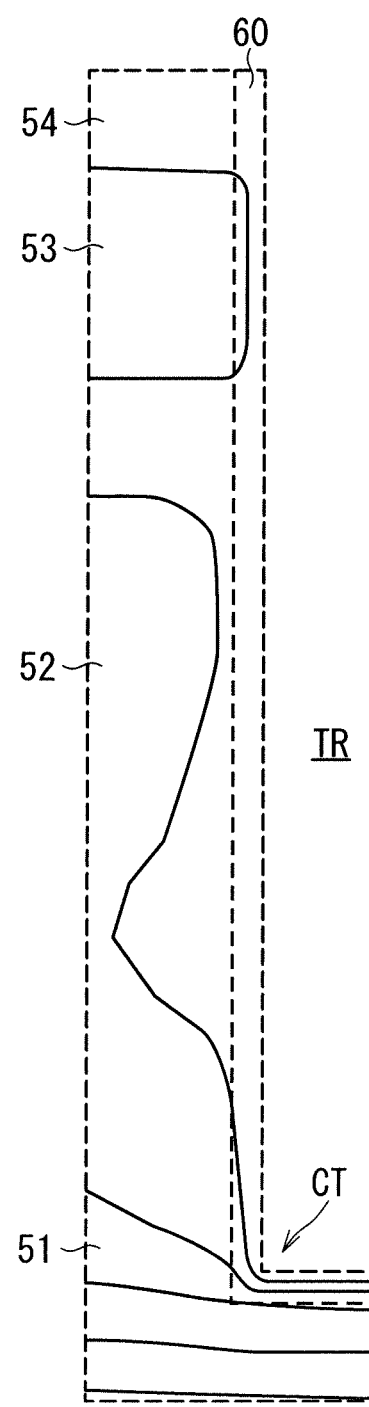
FIG. 24 is a partial cross-sectional view showing a simulation result of potential distribution in an OFF state when a trench pitch is narrower than that in a case of FIG. 23.

FIG. 23 and FIG. 24 respectively are partial cross-sectional views showing simulation results of potential distribution in an OFF state, in the cases where the trench pitch is relatively wide and narrow. In the figure, contour lines represent potentials. When the trench is wide (FIG. 23), the contour lines are dense in the vicinity of a bottom part of the trench TR, particularly at a corner part CT, which means electric field concentration. This electric field concentration may lead to decrease in withstand voltage.

Ninth Preferred Embodiment

Figure 25:
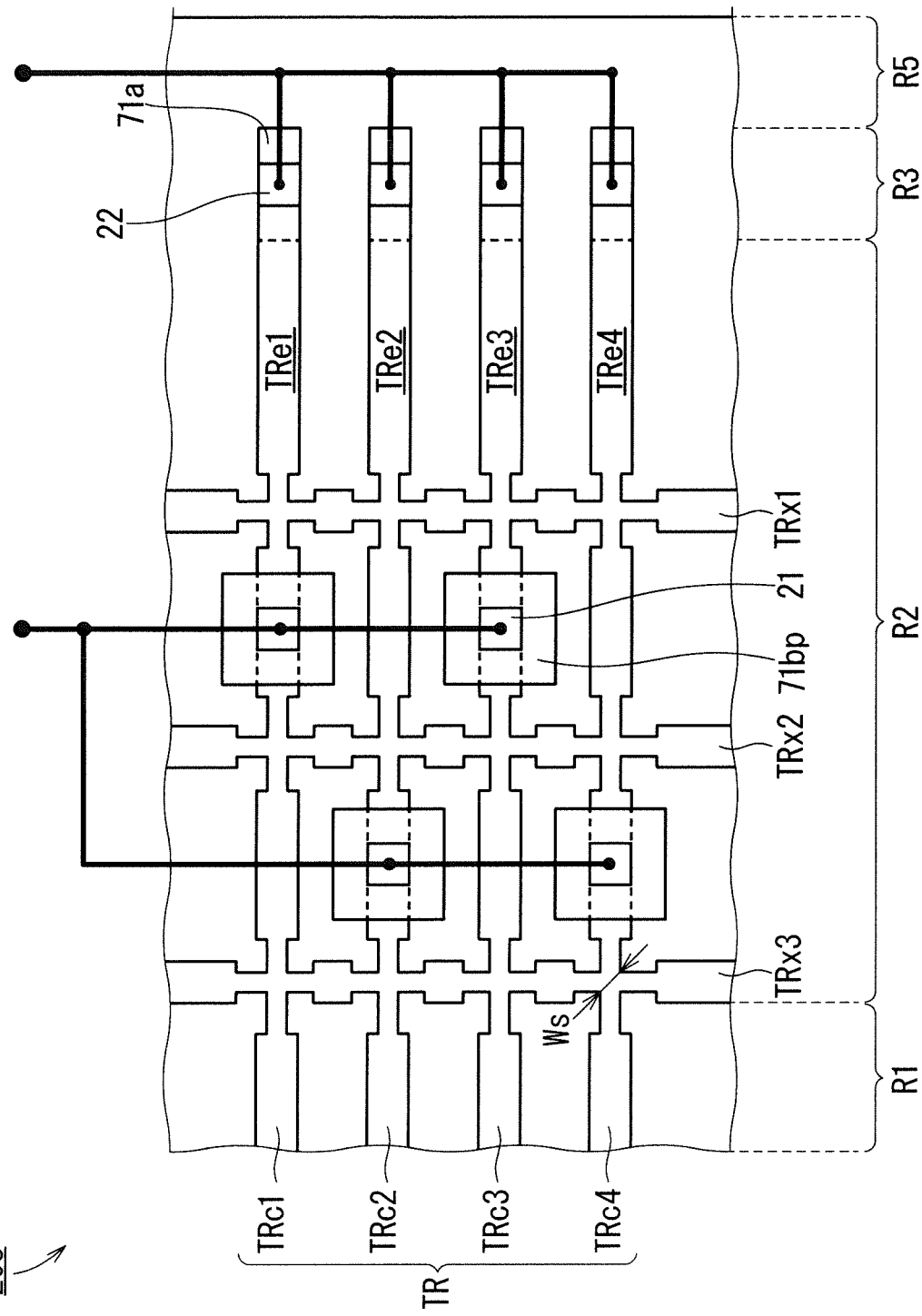
FIG. 25 is a partial top view schematically showing a configuration of a semiconductor device in a ninth preferred embodiment of the present invention.

FIG. 25 is a partial top view schematically showing a configuration of an IGBT 208 (semiconductor device) in a ninth preferred embodiment. Note that, in FIG. 25, some members are not illustrated in order to make the drawing easily viewable.

In the IGBT 208, line widths of extension trench parts TRe1 to TRe4 and crossing trench parts TRx1 to TRx3 are not uniform, as a difference from the IGBT 205 (FIG. 17: the seventh preferred embodiment). Specifically, the extension trench parts TRe1 to TRe4 have a narrower width in a portion in contact with the crossing trench parts TRx1 to TRx3, as compared with a portion distant from the crossing trench parts TRx1 to TRx3. Further, the crossing trench parts TRx1 to TRx3 have a narrower width in a portion in contact with the extension trench parts TRe1 to TRe4, as compared with a portion distant from the extension trench parts TRe1 to TRe4. As a result, a maximum width Ws of an intersection of the extension trench parts TRe1 to TRe4 and the crossing trench parts TRx1 to TRx3 becomes narrow. Note that a configuration other than this is substantially the same as the configuration of the seventh preferred embodiment or the modification thereof described above, so that the same or corresponding elements are denoted by the same reference symbols and description thereof will not be repeated.

According to the present preferred embodiment, since the maximum width Ws is narrowed, it is possible to improve a burying property when depositing an electrode material (typically polysilicon) in a trench. Note that the maximum width Ws of the intersection is narrowed to some extent also by a modification in which one of, rather than both of, the extension trench part and the crossing trench part exclusively has a narrow width as described above. Therefore, even in such a case, an effect similar to that of the present preferred embodiment can be obtained to some extent. Further, the feature that the trench has a locally narrow width as described above can be applied not only to the seventh preferred embodiment but also to the modification of the seventh preferred embodiment or to the eighth preferred embodiment.

Tenth Preferred Embodiment

Figure 26:
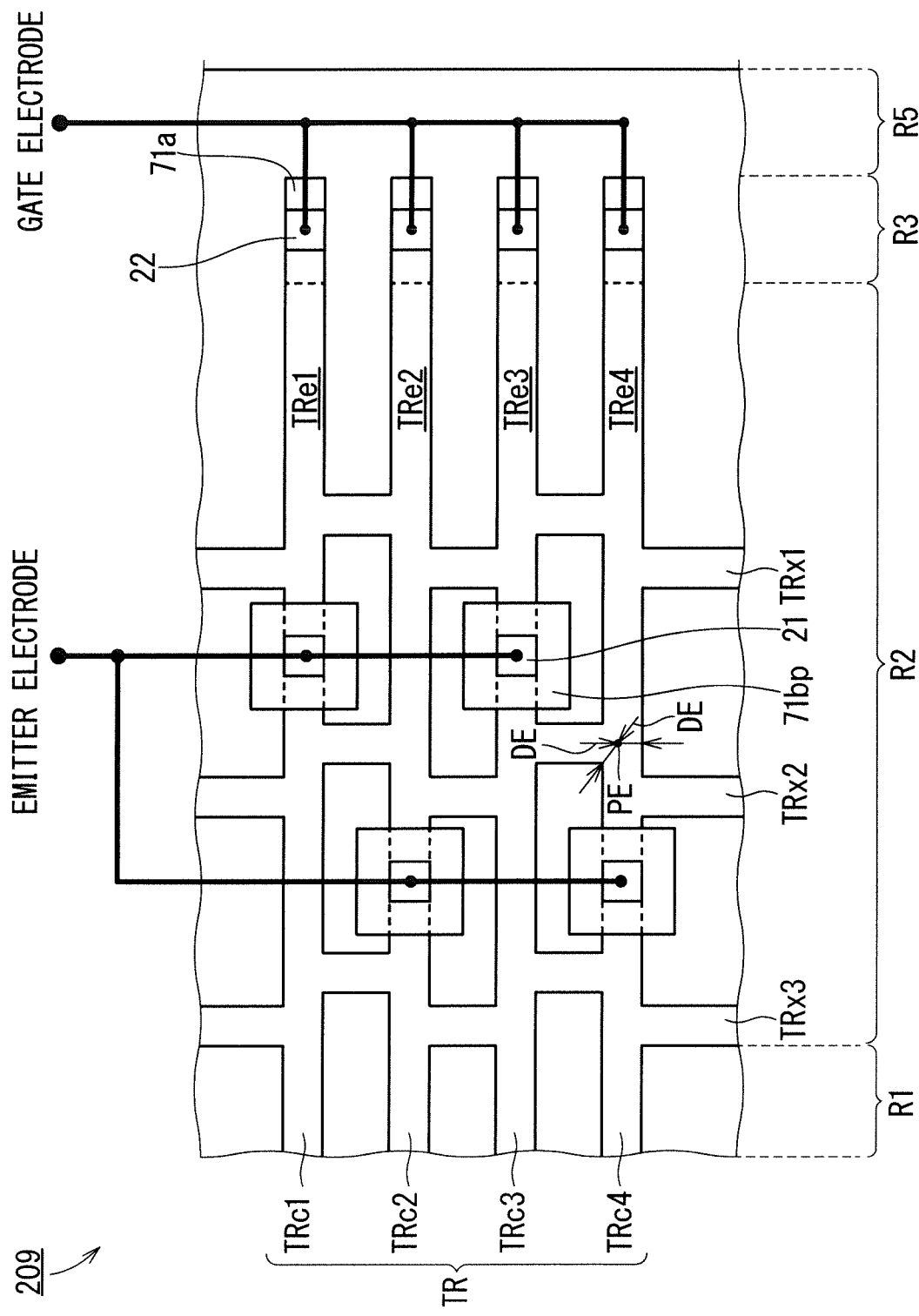
FIG. 26 is a partial top view schematically showing a configuration of a semiconductor device in a tenth preferred embodiment of the present invention.

FIG. 26 is a partial top view schematically showing a configuration of an IGBT 209 (semiconductor device) in a tenth preferred embodiment. Note that, in FIG. 26, some members are not illustrated in order to make the drawing easily viewable.

In the IGBT 209, as a difference from the IGBT 205 (FIG. 17: the seventh preferred embodiment), extension trench parts TRe1 to TRe4 and crossing trench parts TRx1 to TRx3 are mutually connected in a T-shape (not in a cross shape). As a result, a distance DE between a trench sidewall and a position PE farthest from the trench sidewall becomes smaller at a connection part between the extension trench parts TRe1 to TRe4 and the crossing trench parts TRx1 to TRx3. Note that a configuration other than this is substantially the same as the configuration of the seventh preferred embodiment or the modification thereof described above, so that the same or corresponding elements are denoted by the same reference symbols and description thereof will not be repeated.

According to the present preferred embodiment, it is possible to improve a burying property when depositing an electrode material (typically polysilicon) in the trench. Note that the feature that the trench junction has a T-shape as described above can be applied not only to the seventh preferred embodiment but also to the modification of the seventh preferred embodiment or to the eighth preferred embodiment.

In each of the above preferred embodiments, a simple IGBT has been described in detail, but the semiconductor device may be a reverse conducting (RC)-IGBT. Further, the semiconductor device may be different from the IGBT, and may be, for example, a metal insulator semiconductor field effect transistor (MISFET). Further, although the case where the first conductivity type is the n-type and the second conductivity type is the p type has been described in detail, these conductivity types may be reversed. Further, the method of manufacturing the semiconductor substrate is not particularly limited, and the semiconductor substrate may be prepared using a floating zone (FZ) substrate or may be prepared using an epitaxial substrate. The present invention can freely combine each preferred embodiment within the scope of the present invention, and can deform or omit each preferred embodiment as appropriate.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a semiconductor substrate having a first surface, and a second surface that is a surface opposite to the first surface and provided with an opening of a trench, the semiconductor substrate including
      a drift layer of a first conductivity type,
      a carrier storage layer of the first conductivity type, the carrier storage layer being provided on a second surface side of the drift layer facing the second surface and having an impurity concentration higher than an impurity concentration of the drift layer,
      a base layer of a second conductivity type, the base layer being provided on the second surface side of the carrier storage layer and reaching the second surface, and
      an impurity layer of the first conductivity type selectively provided on the second surface side of the base layer, the trench penetrating the impurity layer, the base layer, and the carrier storage layer to reach the drift layer;
   an internal insulating film covering an inner surface of the trench; and
   a trench electrode provided in the trench to face the drift layer, the carrier storage layer, the base layer, and the impurity layer via the internal insulating film,
   wherein the internal insulating film has a first thickness at a portion facing the base layer, has a second thickness at a portion facing the drift layer, and has the first thickness and the second thickness at a portion facing the carrier storage layer, the second thickness being thicker than the first thickness, and
   a width of the trench is tapered from a larger width to a smaller width along at least a portion of the trench that extends from the carrier storage layer through the second surface side of the drift layer into the drift layer in a direction toward a deepest part of the trench electrode, such that the width of the trench at a depth of the deepest part of the trench electrode is smaller than a width of the opening of the trench on the second surface.

2. The semiconductor device according to claim 1, wherein a portion of the internal insulating film deeper than a depth of a deepest part of the trench electrode has a third thickness thicker than the second thickness.

3. The semiconductor device according to claim 1, wherein the trench electrode has an upper electrode in contact with a portion of the internal insulating film having the first thickness, and a buried electrode in contact with a portion of the internal insulating film having the second thickness, and
   the semiconductor device further comprises an isolation insulating film that separates the upper electrode and the buried electrode in the trench is further provided.

4. The semiconductor device according to claim 3, wherein the buried electrode has: an upper surface on the second surface side; a side surface facing the drift layer and the carrier storage layer; and an angular surface disposed between the upper surface and the side surface and being inclined from each of the upper surface and the side surface.

5. The semiconductor device according to claim 3, wherein the upper electrode has a portion opposed to the buried electrode in an in-plane direction of the semiconductor substrate, via the isolation insulating film.

6. The semiconductor device according to claim 3, wherein the buried electrode is electrically floated.

7. The semiconductor device according to claim 3, wherein the buried electrode is electrically connected to the upper electrode.

8. The semiconductor device according to claim 3, wherein the buried electrode is electrically connected to the impurity layer.

9. The semiconductor device according to claim 3, further comprising a main electrode electrically connected to the impurity layer, wherein
   the semiconductor substrate is, as a layout in an in-plane direction, segmented into: a cell region; a gate wiring region to apply a gate potential to the upper electrode; and an electrode wiring region that is disposed between the cell region and the gate wiring region and is to electrically connects the upper electrode to the main electrode,
   in the cell region, the trench has a plurality of cell trench parts individually extending linearly and being adjacent to each other,
   the electrode wiring region of the semiconductor substrate is provided with a plurality of extension trench parts, the plurality of extension trench parts individually extending linearly and being adjacent to each other, and individually extending from the plurality of cell trench parts and electrically connected to the gate wiring region, and
   the plurality of extension trench parts include at least one first trench part in which the upper electrode is electrically connected to the gate wiring region, and at least one second trench part in which the upper electrode is electrically connected to the main electrode.

10. A semiconductor device comprising:
    a semiconductor substrate having a first surface, and a second surface that is a surface opposite to the first surface and provided with an opening of a trench, the semiconductor substrate including
       a drift layer of a first conductivity type,
       a carrier storage layer of the first conductivity type, the carrier storage layer being provided on a second surface side of the drift layer facing the second surface and having an impurity concentration higher than an impurity concentration of the drift layer, a base layer of a second conductivity type, the base layer being provided on the second surface side of the carrier storage layer and reaching the second surface, and an impurity layer of the first conductivity type selectively provided on the second surface side of the base layer, the trench penetrating the impurity layer, the base layer, and the carrier storage layer to reach the drift layer;

an internal insulating film covering an inner surface of the trench; and a trench electrode provided in the trench to face the drift layer, the carrier storage layer, the base layer, and the impurity layer via the internal insulating film, wherein the internal insulating film has a first thickness at a portion facing the base layer, has a second thickness at a portion facing the drift layer, and has the first thickness and the second thickness at a portion facing the carrier storage layer, the second thickness being thicker than the first thickness, the trench electrode has an upper electrode in contact with a portion of the internal insulating film having the first thickness, and a buried electrode in contact with a portion of the internal insulating film having the second thickness, the semiconductor device further comprises an isolation insulating film that separates the upper electrode and the buried electrode in the trench is further provided, the buried electrode is electrically connected to the upper electrode, the semiconductor substrate is, as a layout in an in-plane direction, segmented into: a cell region; a gate wiring region to apply a gate potential to the upper electrode; and an electrode wiring region that is disposed between the cell region and the gate wiring region and is to apply a potential to the buried electrode, in the cell region, the trench has a plurality of cell trench parts individually extending linearly and being adjacent to each other, the electrode wiring region of the semiconductor substrate is provided with a plurality of extension trench parts individually extending linearly and being adjacent to each other, and individually extending from the plurality of cell trench parts and reaching the gate wiring region, and a plurality of crossing trench parts individually extending in a direction crossing the plurality of extension trench parts and being adjacent to each other, and in at least one of the plurality of extension trench parts, between the plurality of crossing trench parts, the buried electrode has a protrusion that is convex toward the opening of the trench and penetrates the upper electrode.

11. The semiconductor device according to claim 10, wherein all of the plurality of extension trench parts have the protrusion.

12. The semiconductor device according to claim 10, wherein a part of the plurality of extension trench parts exclusively has the protrusion.

13. The semiconductor device according to claim 10, wherein the plurality of extension trench parts have a narrower width in a portion in contact with the plurality of crossing trench parts than a portion distant from the plurality of crossing trench parts.

14. The semiconductor device according to claim 10, wherein the plurality of crossing trench parts have a narrower width in a portion in contact with the plurality of extension trench parts than a portion distant from the plurality of extension trench parts.

15. The semiconductor device according to claim 10, wherein the plurality of extension trench parts and the plurality of crossing trench parts are connected to each other in a T-shape.

16. A semiconductor device comprising:

a semiconductor substrate having a first surface, and a second surface that is a surface opposite to the first surface and provided with an opening of a trench, the semiconductor substrate including a drift layer of a first conductivity type, a carrier storage layer of the first conductivity type, the carrier storage layer being provided on a second surface side of the drift layer facing the second surface and having an impurity concentration higher than an impurity concentration of the drift layer, a base layer of a second conductivity type, the base layer being provided on the second surface side of the carrier storage layer and reaching the second surface, and an impurity layer of the first conductivity type selectively provided on the second surface side of the base layer, the trench penetrating the impurity layer, the base layer, and the carrier storage layer to reach the drift layer;

an internal insulating film covering an inner surface of the trench; and a trench electrode provided in the trench to face the drift layer, the carrier storage layer, the base layer, and the impurity layer via the internal insulating film, wherein the internal insulating film has a first thickness at a portion facing the base layer, has a second thickness at a portion facing the drift layer, and has the first thickness and the second thickness at a portion facing the carrier storage layer, the second thickness being thicker than the first thickness, the trench electrode has an upper electrode in contact with a portion of the internal insulating film having the first thickness, and a buried electrode in contact with a portion of the internal insulating film having the second thickness, the semiconductor device further comprises an isolation insulating film that separates the upper electrode and the buried electrode in the trench is further provided, the buried electrode is electrically connected to the impurity layer, the semiconductor substrate is, as a layout in an in-plane direction, segmented into: a cell region; a gate wiring region to apply a gate potential to the upper electrode; and an electrode wiring region that is disposed between the cell region and the gate wiring region and is to apply a potential to the buried electrode, in the cell region, the trench has a plurality of cell trench parts individually extending linearly and being adjacent to each other, the electrode wiring region of the semiconductor substrate is provided with a plurality of extension trench parts individually extending linearly and being adjacent to each other, and individually extending from the plurality of cell trench parts and reaching the gate wiring region, and a plurality of crossing trench parts individually extending in a direction crossing the plurality of extension trench parts, the plurality of crossing trench parts being adjacent to each other, and in at least one of the plurality of extension trench parts, between the plurality of crossing trench parts, the buried electrode has a protrusion that is convex toward the opening of the trench and penetrates the upper electrode.

17. The semiconductor device according to claim 16, wherein all of the plurality of extension trench parts have the protrusion.

18. The semiconductor device according to claim 16, wherein a part of the plurality of extension trench parts exclusively has the protrusion.

19. The semiconductor device according to claim 16, wherein the plurality of extension trench parts have a narrower width in a portion in contact with the plurality of crossing trench parts than a portion distant from the plurality of crossing trench parts.

20. The semiconductor device according to claim 16, wherein the plurality of crossing trench parts have a narrower width in a portion in contact with the plurality of extension trench parts than a portion distant from the plurality of extension trench parts.

21. The semiconductor device according to claim 16, wherein the plurality of extension trench parts and the plurality of crossing trench parts are connected to each other in a T-shape.

* * * * *